(12) United States Patent
Nasle et al.

(10) Patent No.: US 10,331,828 B2
(45) Date of Patent: Jun. 25, 2019

(54) CLOUD COMPUTING ENGINEERING APPLICATION

(71) Applicant: Xendee Corporation, Poway, CA (US)

(72) Inventors: Adib Nasle, Poway, CA (US); Scott K. Mitchell, San Diego, CA (US)

(73) Assignee: Xendee Corporation, San Diego, CA (US)

( * ) Notice: Subject to any disclaimer, the term of this patent is extended or adjusted under 35 U.S.C. 154(b) by 613 days.

(21) Appl. No.: 14/676,651

(22) Filed: Apr. 1, 2015

(65) Prior Publication Data

US 2016/0294635 A1    Oct. 6, 2016

(51) Int. Cl.

| | |
|---|---|
| *G06F 17/50* | (2006.01) |
| *G01R 31/28* | (2006.01) |
| *H04L 12/24* | (2006.01) |
| *H02J 3/00* | (2006.01) |
| *G05B 17/02* | (2006.01) |
| *G06Q 30/02* | (2012.01) |
| *H04L 12/26* | (2006.01) |
| *G06F 3/0484* | (2013.01) |

(52) U.S. Cl.
CPC ..... *G06F 17/5036* (2013.01); *G01R 31/2848* (2013.01); *H04L 41/145* (2013.01); *G05B 17/02* (2013.01); *G06F 3/04842* (2013.01); *G06Q 30/02* (2013.01); *H02J 2003/007* (2013.01); *H04L 41/0654* (2013.01); *H04L 41/22* (2013.01); *H04L 43/0811* (2013.01); *Y04S 40/166* (2013.01); *Y04S 40/168* (2013.01); *Y04S 40/22* (2013.01)

(58) Field of Classification Search
CPC ............. G06F 17/5036; G06F 3/04842; G01R 31/2848; G05B 17/02; H02J 2003/007; Y04S 40/22; Y04S 40/166; Y04S 40/168; G06Q 30/02; H04L 41/145; H04L 41/22; H04L 41/0654; H04L 43/0811
See application file for complete search history.

(56) References Cited

U.S. PATENT DOCUMENTS

| | | | | |
|---|---|---|---|---|
| 5,872,952 | A * | 2/1999 | Tuan .................. | G01R 31/2848 257/E23.079 |
| 5,980,096 | A * | 11/1999 | Thalhammer-Reyero .................. | G05B 17/02 |
| 6,606,731 | B1 * | 8/2003 | Baum .................... | G06F 17/509 716/103 |
| 7,558,705 | B1 * | 7/2009 | Hughes ................. | G06F 17/509 174/34 |
| 8,155,943 | B2 * | 4/2012 | Nasle .................. | G06F 17/5009 700/291 |
| 8,271,927 | B2 * | 9/2012 | Holdsworth ........ | G06F 17/5045 716/119 |
| 8,949,102 | B2 * | 2/2015 | Dai ..................... | G06F 17/5045 703/14 |

(Continued)

OTHER PUBLICATIONS

Autodesk, "AutoCAD Electrical 2010 User's Guide", published by Autodesk, Inc. copyright 2009, pp. 1-2085.*

(Continued)

*Primary Examiner* — Andrew L Tank

(74) *Attorney, Agent, or Firm* — Fish & Richardson P.C.

(57) ABSTRACT

Systems and methods for a cloud computing engineering application that can provide new interaction, visualization and interaction techniques along with advertising messaging and business social networking are disclosed.

18 Claims, 19 Drawing Sheets

(56) References Cited

U.S. PATENT DOCUMENTS

| | | | |
|---|---|---|---|
| 9,697,304 B1* | 7/2017 | Wendlandt | G06F 17/5009 |
| 2002/0193978 A1* | 12/2002 | Soudier | G05B 17/02 |
| | | | 703/18 |
| 2004/0128120 A1* | 7/2004 | Coburn | G05B 17/02 |
| | | | 703/26 |
| 2005/0010380 A1* | 1/2005 | Yanagisawa | G06F 17/5036 |
| | | | 703/2 |
| 2006/0206866 A1* | 9/2006 | Eldrige | G05B 15/02 |
| | | | 717/122 |
| 2012/0022713 A1* | 1/2012 | Deaver, Sr. | G05B 17/02 |
| | | | 700/298 |
| 2013/0031501 A1* | 1/2013 | Kodosky | G06F 3/04842 |
| | | | 715/771 |
| 2015/0006141 A1* | 1/2015 | Enenkel | G06F 17/5036 |
| | | | 703/18 |
| 2016/0003920 A1* | 1/2016 | McQuillan | G06F 17/5036 |
| | | | 702/60 |
| 2016/0084889 A1* | 3/2016 | Mezic | G05F 1/66 |
| | | | 702/60 |

OTHER PUBLICATIONS

Bellovin et al. "Electrical Wiring FAQ [Part 1/2]", Feb. 8, 2001, https://web.archive.org/web/20010208202952/http://www.faqs.org/faqs/electrical-wiring/part1/, pp. 1-15 (Year: 2001).*

* cited by examiner

CLOUD COMPUTING ENGINEERING APPLICATION

TECHNICAL FIELD

The subject matter of this application relates generally to cloud computing applications.

BACKGROUND

Computer models of complex systems enable improved system design, development, and implementation through simulation. That is, system models can be created on computers and simulated to assist in the determination of system design parameters. All manner of systems can be modeled, designed and simulated this way, including machinery, factories, electrical power and distribution systems, processing plants, devices, chemical processes, biological systems, and the like. Such design and simulation techniques have resulted in reduced development costs and superior operation.

With many analytical tools, the manner in which data and results are requested from and communicated to the user is often as important as the choice of the analytical tool itself. However, existing systems have not developed new user interface techniques to address the needs of cloud computing engineering solutions and services.

That is, existing technologies are based on decade's old PC or desktop centric user interface paradigms. In fact, current methods have created complexity and a poverty of attention for engineers, researchers and students, and rely on user guides and formal training to overcome the significant learning curves they impose.

Without new techniques in user interfaces, engineering design and simulation systems will struggle to realize the full potential of cloud computing and its ability to democratize how we approach scientific discovery in power and energy engineering.

Greater efforts at creating user interfaces that better organize, visualize and expose data within the context of the internet and cloud computing would provide a much friendlier, exciting and modern environment that can improve design accuracy, minimize complexity, and enable a broader class of users to participate in the discovery of novel solutions to address climate change, and the integration of renewable energy sources.

Computer Aided Design (CAD), Product Lifecycle Management (PLM), and related engineering systems currently deliver collaborative features that have increased the effectiveness of physically dispersed engineering teams. However, none have created collaboration techniques to effect advertising messaging.

Current web messaging methods rely on highly targeted "push" advertisements. Such random communication does not reveal intention very well and the value of this form of advertising is low. The challenge for existing advertising techniques is that users are less tolerant to advertising as they see it to be an intrusion. In fact, as a web site or Internet service becomes more attractive to advertisers, it becomes less appealing to members who see highly targeted ads as invading privacy.

Current business oriented social networking platforms have enhanced the ability for professionals to build their identity, connect with peers, and discover opportunities. None, however, provide a means to effectively validate the technical capabilities and skills members claim.

With existing techniques, engineers can establish a profile claiming to have specific skills and also provide links to past projects or post a static gallery of previous projects as evidence of proficiency or experience. Some methods also use peer recommendations and endorsements to help address the challenge in validating skill claims. While these methods are an improvement, they are still essentially word of mouth techniques that do not solve a technical recruiter's need to measure and validate claimed technical skills. The need for engineers to connect with and manage career opportunities, and collaborate on engineering design projects will become even more essential with the many electrical projects of the energy optimized world.

SUMMARY

Systems and methods for a cloud computing engineering application user interface, advertising messaging, and business oriented social networking are disclosed.

According to one aspect, a method to better organize and expose electrical power system design and simulation data can comprise of: unique business logic coupled with the use of a simple-to-complex data hierarchy with a layered topology where data complexity increases as each lower layer of data is exposed. Simple, first-level data fields define general design information such as equipment name and description, while middle-level data fields expose more complexity to further describe the electrical characteristics, including connectivity, with bottom-level data fields providing the most complex data for more sophisticated and granular analysis, such dynamic simulations that can consider not just the static behavior of a system, but also behavior based on time and location data. Each layer slides down to reveal greater complexity, similar to how a person thinks to "dig deeper" to find greater complexity within a physical context. Ancillary data at each layer can be exposed via interface panels that slide horizontally to the right or left. The data displayed may be editable, view-only or a combination of both.

In some implementation, a method comprises: generating, by a server computer, a user interface element, the user interface element configured to display a first layer of simulation data on a client device, the simulation data for use by a system being simulated on the server computer, the displayed first layer of simulation data representing a first level of complexity of the system; receiving, by the server computer, a first input from the client device; and responsive to the first input, configuring the user interface element to display a second layer of simulation data on the client device, the second layer of simulation data representing a second level of complexity of the system that is greater than the first level of complexity of the system, the displayed second layer of simulation data visually indicating a hierarchical relationship of complexity between the first and second layers of simulation data.

According to one aspect, a method is disclosed for leveraging the cognitive time flexibility afforded at the first point of user interaction (e.g., error-checking) to address responsiveness concerns with a cloud computing engineering application at the second point of user interaction (e.g., initiating an analysis process or simulation).

In some implementations, a method comprises: displaying, by a computing device, a first user interface element for user selection of an analysis or simulation type for a computer simulation of a virtual electrical power distribution system; receiving, by the first user interface element, user selection of an analysis or simulation type; performing, by the computing device, a first error check for data and connectivity errors related to the analysis or simulation type; if a first set of errors is discovered during the first error check: generating, by the computing device, first feedback for correcting the first set of errors; receiving, by the computing device, first user corrections of the first set of errors; correcting, by the computing device, the first set of errors based on the received first user corrections; if no errors are discovered during the first error check: automatically performing, by the computing device, the selected analysis or simulation type on the virtual electrical power distribution system; if a second set of errors is discovered during performance of the selected analysis or simulation type: generating, by the computing device, second feedback for correcting the second set of errors; receiving, by the computing device, second user corrections of the second set of errors; correcting, by the computing device, the second set of errors based on the second user corrections; if a second set of errors is not discovered during performance of the selected analysis or simulation type: displaying a second input element to run the selected analysis or simulation; receiving, by the second user interface element, user selection to perform the selected previously selected analysis or simulation type; and responsive to the user selection to run the selected analysis or simulation type, displaying the previously calculated results from the performed analysis or simulation type.

According to another aspect, a method to better visualize and expose electrical power system design and simulation data can comprise of: a cloud computing application to perform design and simulation of multi-phase power system networks that includes a single, multi-color line as a technique to connect electrical equipment. In power engineering, a simplified visual notation for representing electrical power distribution systems is used which is often referred to as a single-line diagram or a one-line diagram. That is, rather than representing each of the three phases of an electrical system (phases A, B, and C) with a separate line or terminal, only one solid line is represented. A single, multi-color line overcomes the visual limitations of current methods without introducing the complexity of representing each phase with a separate line or terminal, or requiring separate one-line diagrams for each phase. A single, multi-color line can display multiple and single phases, thus power engineers can more easily understand phase connectivity for radial or meshed electrical network regardless of size or complexity while still maintaining the simplified notation advantages of a single-line or one-line diagram.

In some implementations a method comprises: displaying, by a computing device, a first component object representing a first component of an electrical power distribution system; displaying, by the computing device, a second component object representing a second component of the electrical power distribution system; and displaying, by the computing device, a connector object connecting the first and second component objects, the connector object beginning at the first component object as a first single line, branches into a number of internal lines, then reconnects into a second single line at the second component object, wherein each of the internal lines is a different color and represents a different phase of the electrical power distribution system.

According to another aspect, embedded and unique application logic further helps enhance application engagement, automate the engineering design process and minimize errors and illogical system connections.

In some implementations, a method comprises: displaying, by a computing device, a first component object connected between connection points of a simulated electrical power distribution system, the first component object representing a first component in the simulated electrical power distribution system; and automatically configuring, by the computing device, the first component object to inherit electrical characteristics of the connection points.

According to another aspect, a method for advertising messaging can comprise of: a collaborative cloud computing engineering application that provides a user who is a buyer and a user who is an advertiser access to on-line collaboration features and the same exact electrical power system design and analysis tools. The user who is a buyer can invite advertisers to offer advice on their product features and benefits. The buyer can share electrical power system project data with the advertisers and use simulation features to validate the performance and benefits of the advertiser's recommended product(s) on the buyer's simulation model.

According to another aspect, a method for business social networking can comprise of: a collaborative cloud computing engineering application that provides a user who is a recruiter and a user who is an engineer seeking work access to on-line collaboration features and the same exact electrical power system design and analysis tools. The recruiter can screen candidates by presenting each with precise engineering design challenges or a sample of an actual power system project that both can collaboratively view, edit, analyze and discuss.

In some implementations, a method comprises: providing, by a server computer, an interactive development environment for developing and simulating a virtual electrical power distribution system; providing, by the server computer, a collaborative interface in the interactive development environment for allowing users to share a project, the collaborative interface configured to allow the users access, using client devices in communication with the server device, a copy of a shared project maintained by the server device, and to edit the shared project; and providing, by the server computer, user interface elements that are selectable by the users on their respective client devices to perform an analysis or simulation of the shared project and share the results of the analysis or simulation in the collaborative interface.

Particular implementations disclosed herein provide one or more of the following advantages. A cloud computing engineering application provides engineers with a reason to stay on a site and can monopolize the time they spend on the Internet. Integrating such an application with a collaborative advertising technology layer designed for value added two-way dialogue between a vendor (advertiser) and an engineer (buyer) can transform advertising messaging from the intrusive "push" model of today to a new "advice" model. That is, an application user who is an engineer initiates a request to communicate with an application user who is a vendor in order to get advice on how to address a particular need or solve a technical challenge with their electrical power system design.

Such a collaborative advertising technology layer within a cloud computing engineering application provides the engineer and the vendor access to the same exact design and analysis tools, power system specifications and simulation data. This affords the vendor with the ability to collaboratively demonstrate product features that address the engineer's needs using the engineer's own model and design data. Moreover, the vendor can validate the effectiveness of recommended products to the engineer through simulation techniques the engineer already trusts and uses. This approach to advertising messaging is fundamentally different than current techniques as it is not random, reveals intention, and is highly valuable since it provides vendors with the opportunity to demonstrate their product's benefits at the most influential stage—the design phase.

These and other features, aspects, and embodiments are described below in the section entitled "Detailed Description".

BRIEF DESCRIPTION OF THE DRAWINGS

Features, aspects, and embodiments are described in conjunction with the attached drawings. For a more complete understanding of the principles disclosed herein, and the advantages thereof, reference is now made to the following descriptions taken in conjunction with the accompanying drawings.

DETAILED DESCRIPTION

Systems and methods for a cloud computing engineering application that can provide new interaction, visualization and interaction techniques along with advertising messaging and business social networking are disclosed. It will be clear, however, that the disclosed embodiments may be practiced without some or all of these specific details. In other instances, well known process operations have not been described in detail in order not to unnecessarily obscure the description of the disclosed embodiments.

As used herein, a system denotes a set of components, real or abstract, comprising of a whole where each component interacts with or is related to at least one other component within the whole. Examples of systems include machinery, factories, electrical systems, processing plants, devices, chemical processes, biological systems, data centers, aircraft carriers, and the like. An electrical system can designate a power generation and/or distribution system that is widely dispersed (e.g. power generation, loads, and/or electrical power distribution components distributed geographically throughout a region large or small) or bounded within a particular location (e.g. a power distribution system within a production facility, factory, data center, ship, etc.).

Cloud computing is a model for enabling ubiquitous, convenient, on-demand network access to a shared pool of configurable computing resources (e.g., networks, servers, storage, applications, and services) in order to store, manage, and process data.

Cloud computing application is an application deployed via a cloud computing model (e.g. private cloud, community cloud, public cloud, or a hybrid cloud) using either Software as a Service (SaaS), Platform as a Service (PaaS), or Infrastructure as a Service (IaaS), service models.

Figure 1:
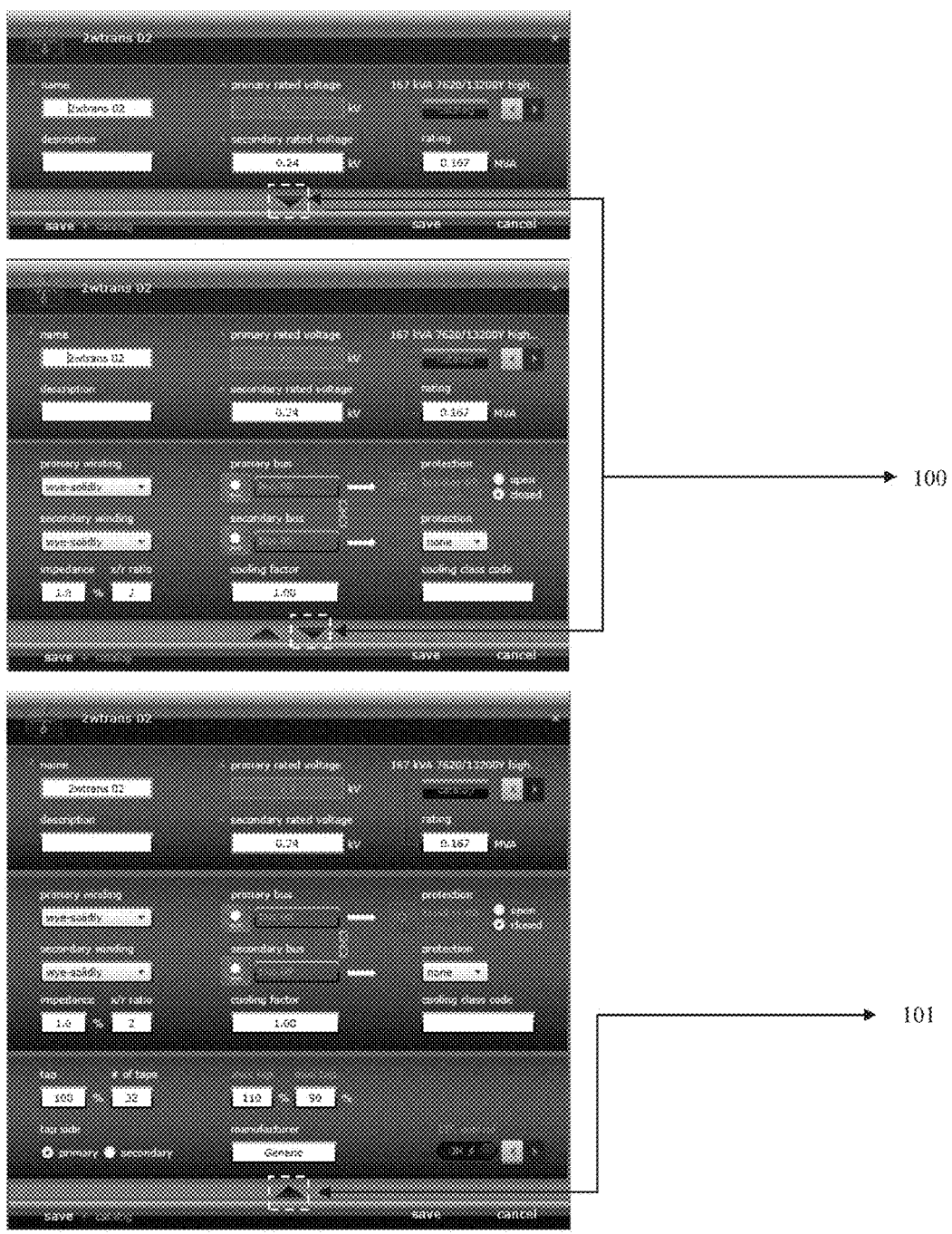
FIG. 1 is an illustration of a simple-to-complex data hierarchy with a layered topology where data complexity increases as each lower layer of data is exposed in accordance with one embodiment.

FIG. 1 is an illustration of a system utilizing a simple-to-complex data hierarchy with a layered topology where data complexity increases as each lower layer of data is exposed. Users are first presented with the simplest, top-level data fields and can interact with a down button 100 to drill deeper to find greater complexity in defining the electrical characteristics of a system. An up button 101 provides the ability to hide complex layers and return back to the simplest, top-level data field. The data displayed may be editable, view-only or a combination of both.

Figure 2:
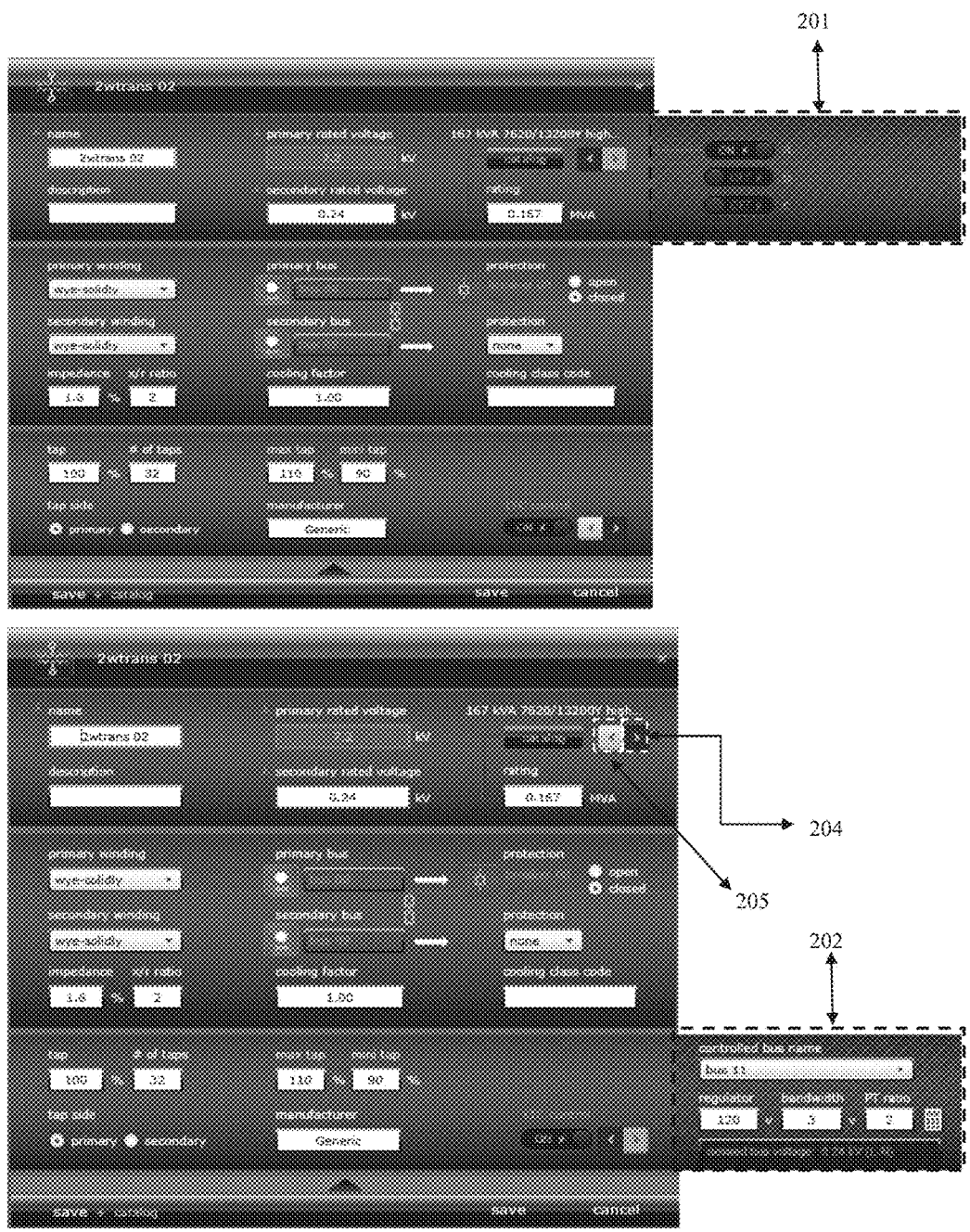
FIG. 2 is an illustration of the user interface described in FIG. 1 with ancillary data exposed at different layers via interface panels that slide in accordance with one embodiment.

FIG. 2 is an illustration of the user interface described in FIG. 1 with ancillary data exposed at different layers via interface panels that slide horizontally 201 and 202. A forward button 204 shows a panel, while a back button 205 hides a panel. The data displayed may be editable, view-only or a combination of both.

Figure 3:
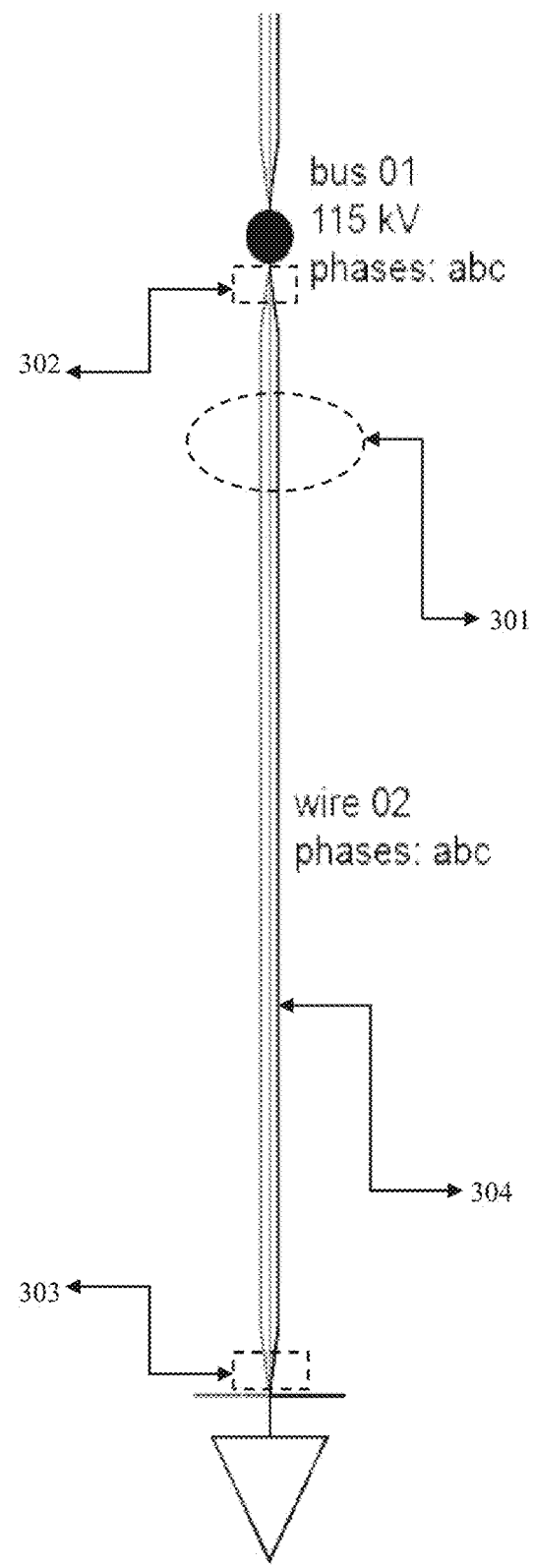
FIG. 3 is an illustration of single, multi-color line for single-line or one-line diagram visualization of a system in accordance with one embodiment.

FIG. 3 is an illustration of a 3-phase design (phases: A, B, and C) with a single, multi-color connector object for single-line or one-line diagram visualization of a system. In one embodiment, the connector object begins as a single-line 302, branches or splits out to a number of internal lines 301, and reconnects as a single-line 303. Each internal line 304 of internal lines 301 can have a unique color to better differentiate each phase of the connection.

Figure 4:
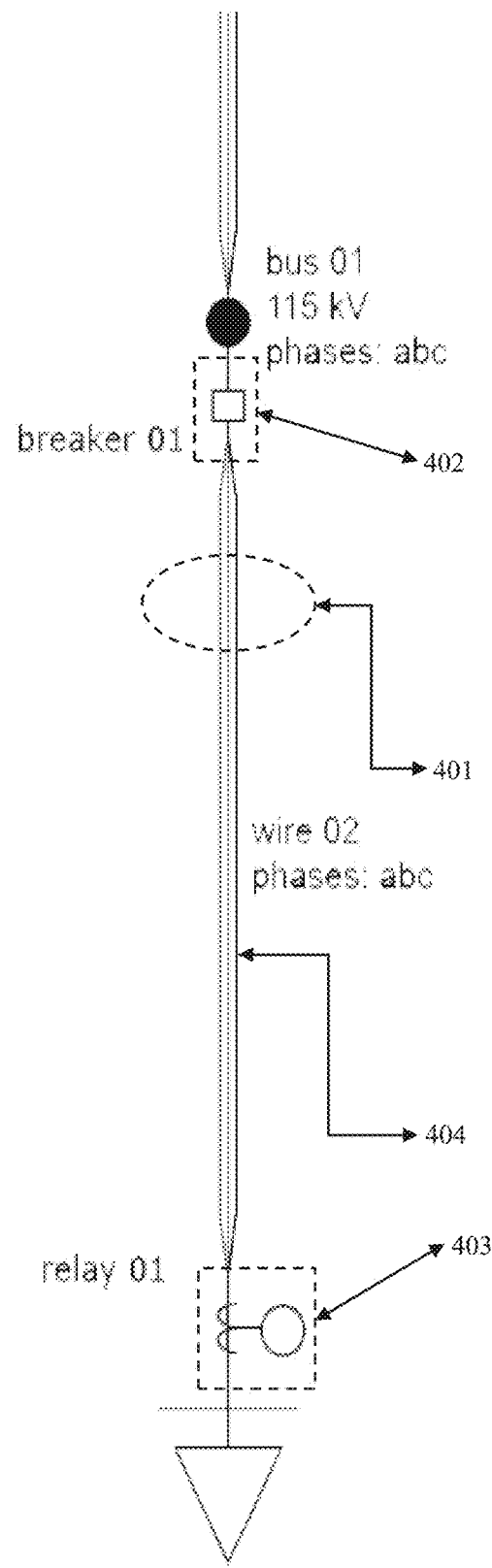
FIG. 4 is an illustration of an enhancement of the system described in FIG. 3 with protective devices (e.g. circuit breaker, fuse, relay, switch . . . etc.) included in accordance with one embodiment.

FIG. 4 is an illustration of an enhancement of the system described in FIG. 3 with protective devices (e.g. circuit breaker, fuse, relay, switch . . . etc.) included. A first component object representing a first component in an electrical power distribution system (e.g., a circuit breaker 402) and a second component object representing a second component in the electrical power distribution system (e.g., a relay 403) connect as single-line objects at different ends of the connector object. In the example shown, the connector object begins as a single-line from a protective device 402, branches or splits out to the necessary number of internal lines 401, and reconnects back as a single line to the protective device 403. Each internal line 404 can have a unique color to better differentiate each phase of the connection. In one embodiment, the protective devices can animate to either an open or closed position in order to connect or disconnect equipment from the system. In another embodiment, the equipment's connection status (e.g. connected, disconnected, on or off) affects a change in color for the equipment and related system components to visually reflect the presence or absence of voltage. For example, a transformer connected to a power source may be displayed in the black, and a transformer disconnected from a power source may be displayed in gray.

Figure 5:
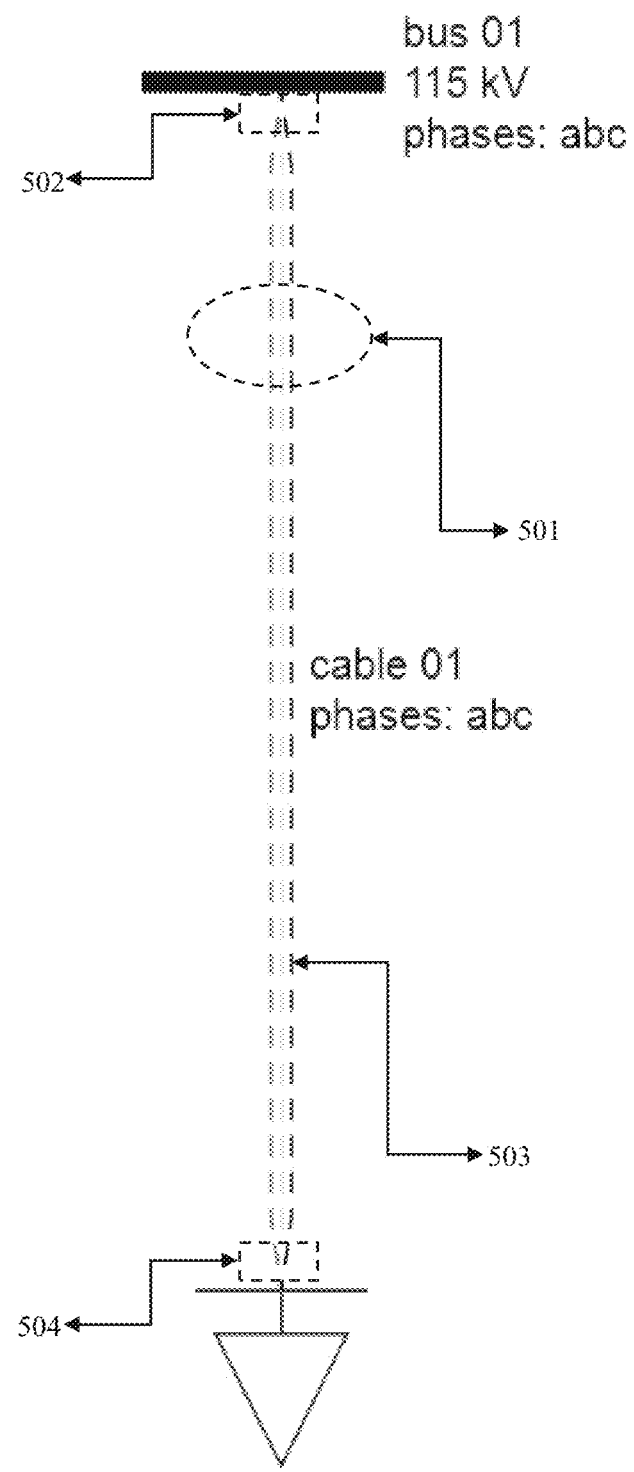
FIG. 5 is an illustration of an alternative visualization of the system described in FIG. 3 in accordance with one embodiment.

FIG. 5 is an illustration of an alternative visualization of the system described in FIG. 3. The connector object begins as a broken single-line 502 branches out to the necessary number of broken lines 501, and reconnects as a broken single-line 504. Each internal line 503 can have a unique color to better differentiate each phase of the connection. A broken line, within a system, may represent an underground connection.

Figure 6:
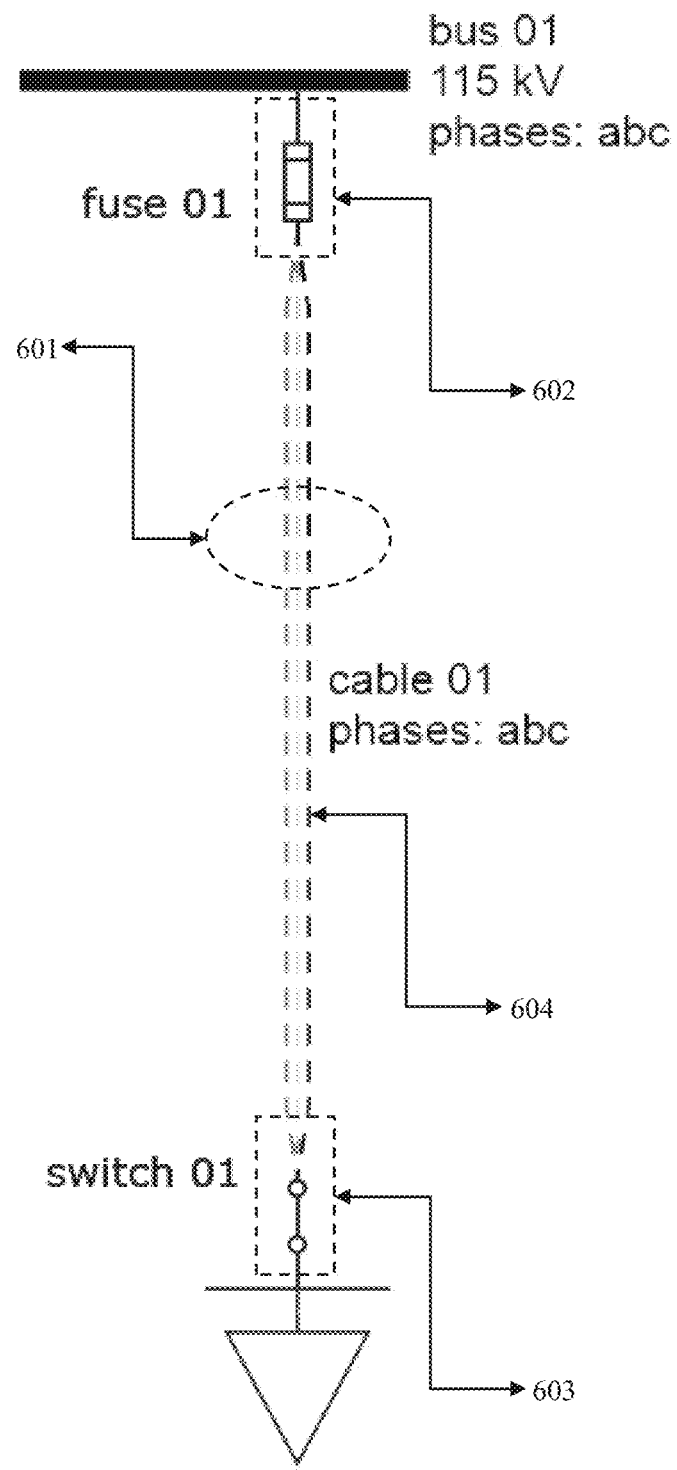
FIG. 6 is an illustration of an alternative visualization of the system described in FIG. 4 with protective devices (e.g. circuit breaker, fuse, relay, switch . . . etc.) included in accordance with one embodiment.

FIG. 6 is an illustration of an alternative visualization of the system described in FIG. 4. A protective device (such as a fuse 602 and a switch 603) connects as a single-line component object at different ends of the connector object. In the example shown, the connector object begins as a broken single-line from a protective device 602, branches out to the necessary number of internal lines 601, and reconnects back as a broken single line to the protective device 603. Each internal line 604 can have a unique color to better differentiate each phase of the connection. A broken line, within a system, may represent an underground connection.

Figure 7:
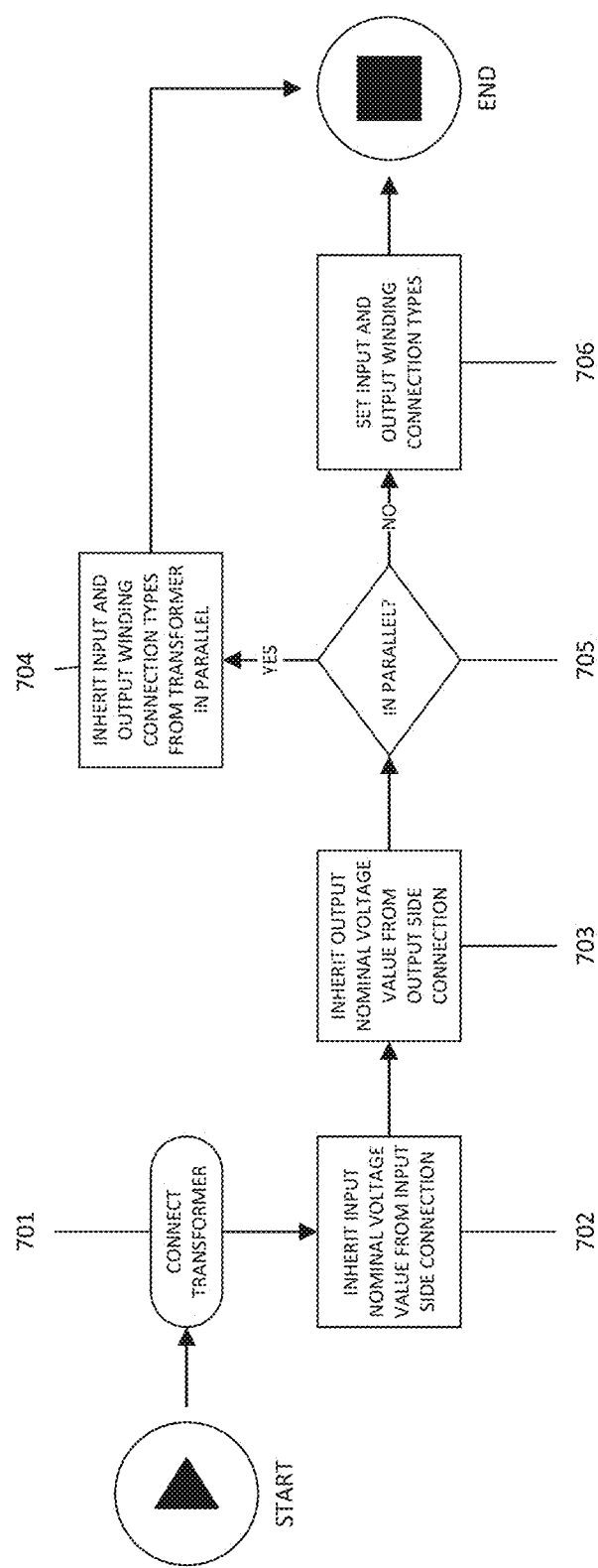
FIG. 7 is an illustration of a flowchart describing a method to eliminate design errors, minimize complexity and manage data for system equipment connections that are transformers in accordance with one embodiment.

FIG. 7 is an illustration of a flowchart describing a method to eliminate design errors, minimize complexity and manage data for system equipment connections that are transformers. In one embodiment a new transformer is uniquely connected between two points within a system. The newly connected transformer 701 automatically inherits the existing nominal voltage values of its connection points. For example, if a transformer is connected between two existing locations in a system, with the input connection having a nominal voltage of 13,800 and the output connection having a nominal voltage of 480, the new transformer's nominal input 702 and nominal output 703 voltage values are automatically assigned to these existing values. The user can define specific input and output side winding connections 706 (e.g. delta, wye-grounded, wye-ungrounded, wye-impedance grounded, or zig-zag grounded). In another embodiment, a new transformer is connected in parallel between two points within a system. That is, at least one other transformer connection already exists between the two locations in the system the new transformer is connecting. Similar to the first embodiment, the new transformer 701 automatically inherits the existing nominal voltage values from its input 702 and output 703 connection points. The cloud computing engineering application next checks the system 705 to determine if the new transformer is being connected in parallel with an existing transformer. If true, the new transformers' winding connections for both the input and output sides 704 are set to the same values of the existing, in parallel transformer.

Figure 8:
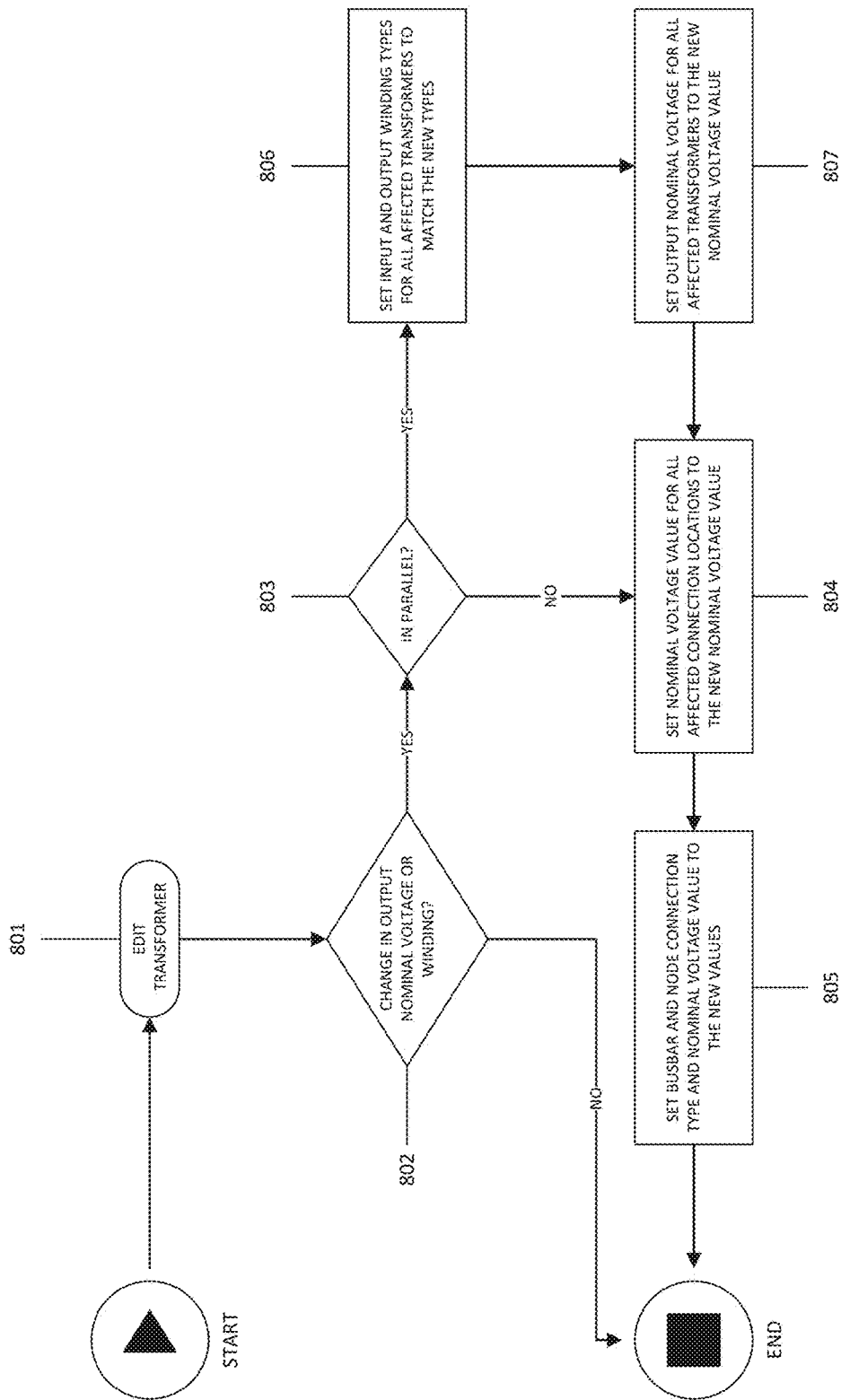
FIG. 8 is an illustration of a flowchart describing a method to eliminate design errors, minimize complexity and manage data for system equipment connections that are transformers in accordance with another embodiment.

FIG. 8 is an illustration of a flowchart describing a method to eliminate design errors, minimize complexity and manage data for system equipment connections that are transformers. In one embodiment, an existing transformer is edited 801. If the edited transformer is not connected in parallel with another transformer 803, and if a change is made to the edited transformer's output nominal voltage and/or output winding connection 802, then all affected connections 804 within the system will change their nominal voltage value to match that of the edited transformer. All affected busbars and nodes 805 will change both their nominal voltage and connection type to match the edited transformer's nominal output voltage and output winding connection. In another embodiment, if an existing transformer is connected in parallel 803 with another transformer, and if it is edited 801, and its nominal output voltage and/or winding connections on the input or output side are changed 802, then the parallel transformer's winding types will change to those of the edited transformer 806. Also, the parallel transformer's nominal output voltage value will change 807 to that of the edited transformers nominal output voltage value, and all affected connections 804 within the system will change their nominal voltage value to match that of the edited transformer. All affected busbars and nodes 805 will change both their nominal voltage and connection type to match the edited transformer's nominal output voltage and output winding connection.

Figure 9:
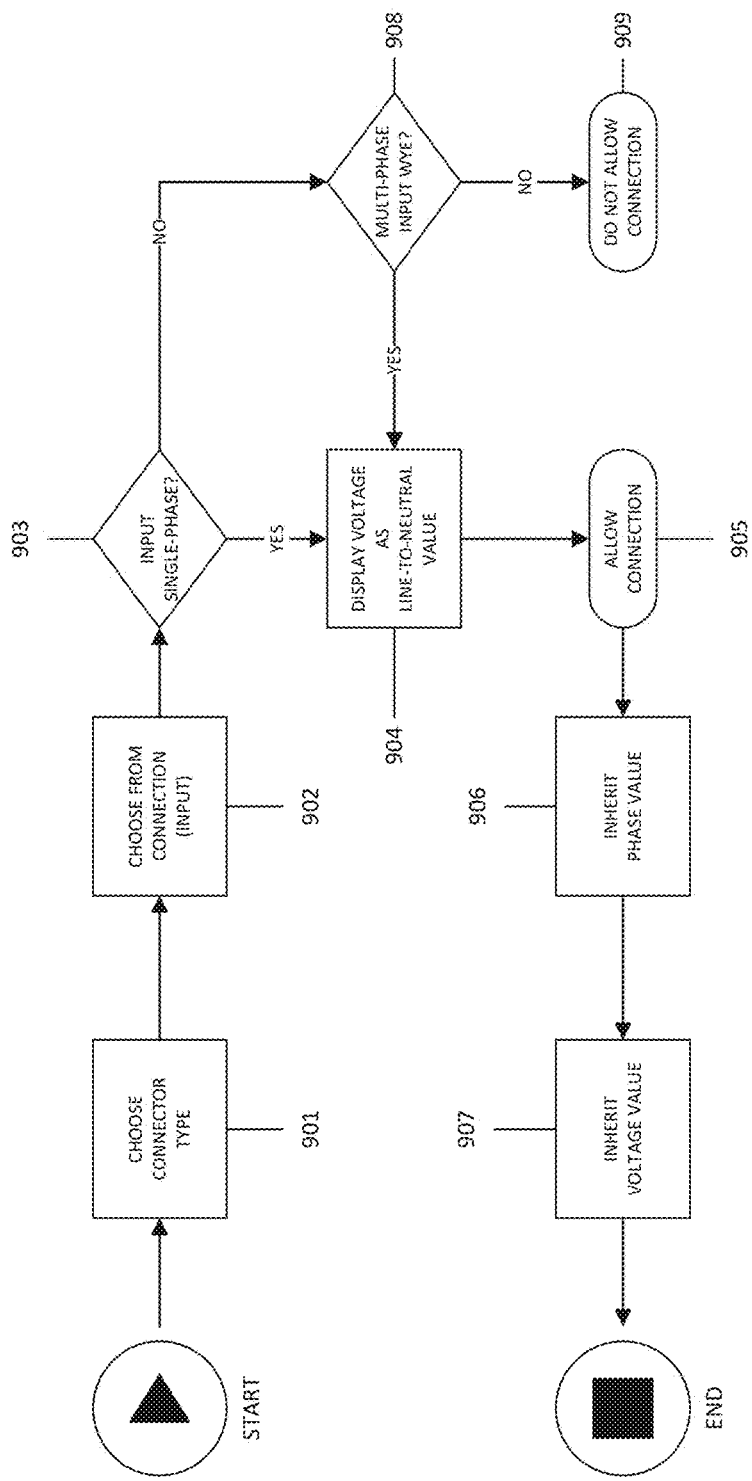
FIG. 9 is an illustration of a flowchart describing a method to eliminate design errors, minimize complexity and manage data for system equipment connections that are single-phase in accordance with one embodiment.

FIG. 9 is an illustration of a flowchart describing a method to eliminate design errors, minimize complexity and manage data for system equipment connections that are single-phase, such as single-phase loads in a system. For example, single-phase load equipment can only be connected from existing system locations that are already single-phase, or multi-phase locations where a wye connection (or a neutral leg) is available. In one embodiment, a load is not allowed to serve as a "From" side connection, and is only available as a "To" side connection. That is, the connection cannot originate from the load equipment. If a load is to be connected to a system a connector type is selected 901 such as a cable, wire, transformer, line voltage regulator, or an automatic transfer switch. The "From" side connection for the connector is chosen from a list of available system equipment 902 that is limited to system sources, busbars and nodes. Next the desired phase (A, B, or C) for the connection is selected. The cloud computing engineering application checks the characteristics of the input connection 903 to determine if it is single-phase. If the "From" side connection is single-phase then the connection is allowed 905 and the load displays 904 and inherits the phase 906 and voltage 907 values of the "From" side connection. In another embodiment, if the "From" side connection is multi-phase, then the cloud computing engineering application checks 908 to determine if a wye connection is available. If true, then the connection is allowed 905 and the load displays 904 and inherits the phase 906 and voltage 907 values of the "From" side connection. If false, the connection is not allowed 909.

Figure 10:
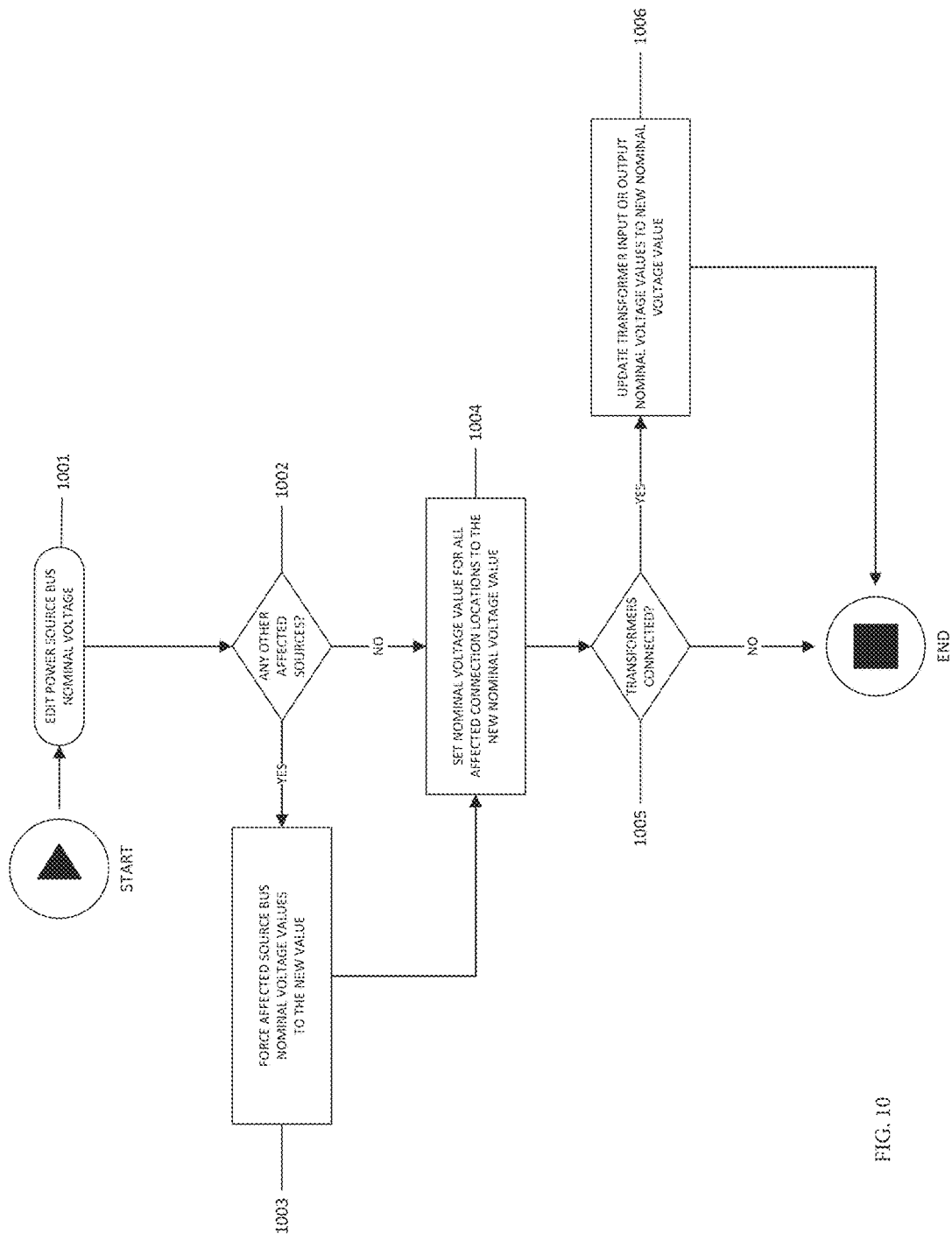
FIG. 10 is an illustration of a flowchart describing a method to manage design data for electrical power source connections within a system in accordance with one embodiment.

FIG. 10 is an illustration of a flowchart describing a method to manage design data for electrical power source connections within a system. In one embodiment, an existing and connected power source is edited 1001 and the nominal voltage value of this power source is changed. The cloud computing engineering application checks 1002 to determine if any other system power sources that are affected by this change in value are connected to the system. If true, the other system power source objects (utility, generator, solar, wind-turbine, capacitor . . . etc.) are forced to inherit the nominal voltage 1003 of the edited power source 1001. Next, all affected buses (loads, motors, UPS, MCC . . . etc.) connected to the system 1004 also inherit the new nominal voltage value defined by the edited power source object 1001. The cloud computing engineering application next checks to determine if any affected transformers are connected 1005 to the system. If true, then each affected transformer's nominal voltage input or nominal voltage output values are accordingly updated 1006 to the edited system power source object 1001 nominal voltage value. In another embodiment, power sources are only allowed to have a single connection to the system. If multiple connections to a system are desired, then a power source must be connected to a busbar from which additional connections can originate.

Figure 11:
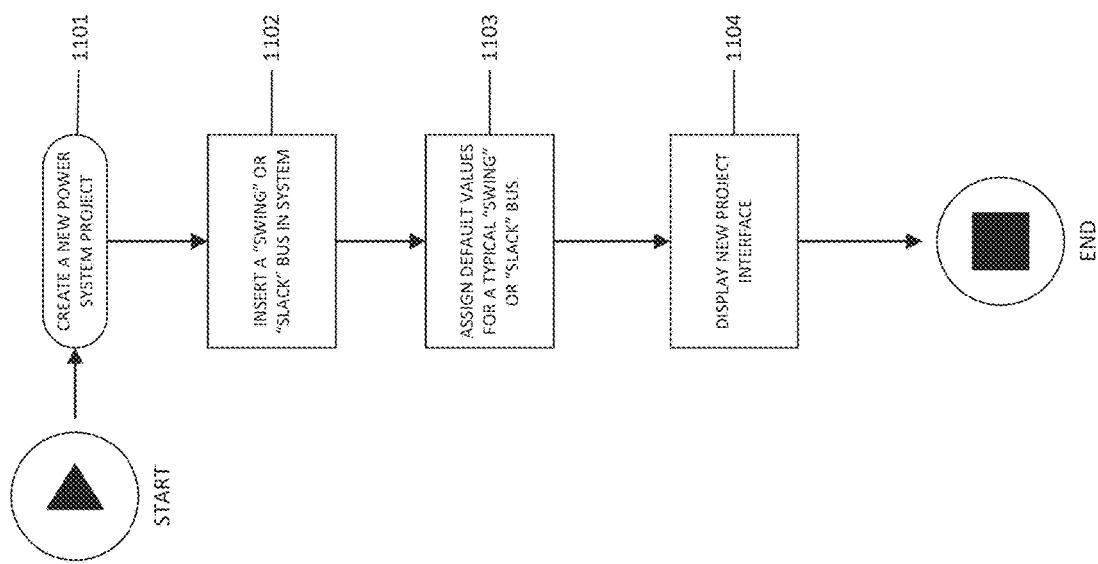
FIG. 11 is an illustration of a flowchart describing a method to create a new system design project in order to minimize simulation errors in accordance with one embodiment.

FIG. 11 is an illustration of a flowchart describing a method to create a new system design project in order to minimize simulation errors. For example, many power flow or load flow simulation techniques require at least one "slack" bus or "swing" bus (sometimes also known as the reference bus) to be included as part of the system being simulated. A swing bus or slack bus is typically represented as a power utility connection point or source and provides the reference system phase angle. Since the real energy requirements for a particular system design or configuration is not known prior to simulation, a slack bus or swing bus is usually needed in order to absorb all uncertainties arising when attempting to simulate a system. If a user does not include a slack bus or swing bus into their design, then there is a high failure probability in performing a simulation on the system. In order to minimize the potential for this, the cloud computing engineering application automatically inserts 1102 a swing bus or slack bus into all new power system project designs 1101, and pre-defines typical or default electrical characteristics and data values for a swing or slack bus 1103 and only then presents a new project user interface (for authoring, editing and viewing the system) 1104. This technique ensures that all new projects have at least one slack bus or swing bus included in the design.

Figure 12:
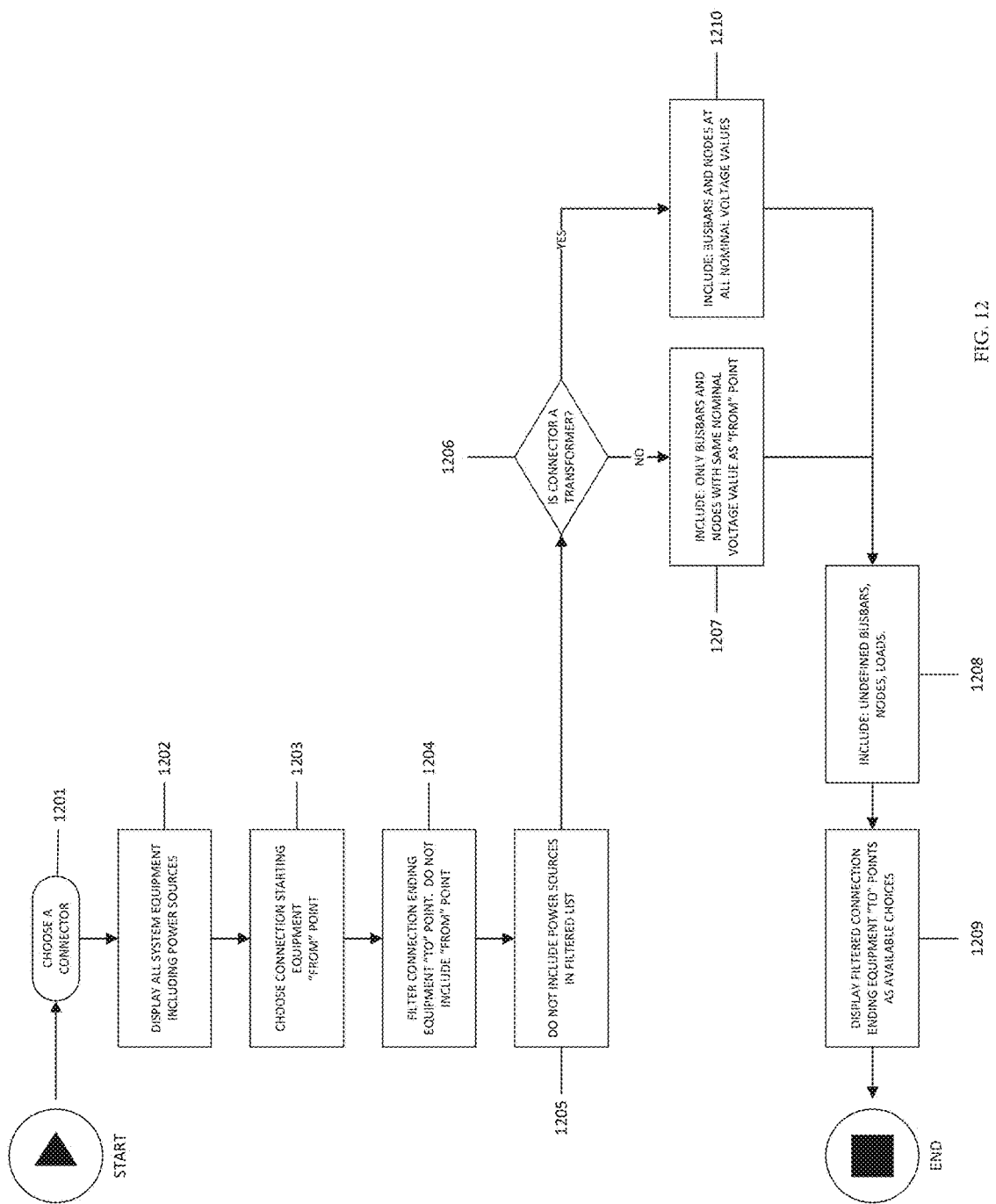
FIG. 12 is an illustration of a flowchart describing a method to manage connections between equipment within a system in order to minimize complexity, design errors and illogical connections in accordance with one embodiment.

FIG. 12 is an illustration of a flowchart describing a method to manage connections between equipment within a system in order to minimize complexity, design errors and illogical system configurations. An electrical power system may have system equipment that operates at different nominal voltage levels and as single or multi-phase (such as single-phase, two-phase, or three-phase). In one embodiment, when a connector 1201 that is not a transformer 1206 is selected, and the system equipment from which the connection starts at is chosen 1203, the cloud computing engineering application filters all system equipment 1204 and provides a list of possible system equipment to which the connector can end its connection at 1210. This list is filtered based on the nominal voltage value of the starting system equipment 1203. System power sources (e.g. power utility, generator, solar, wind-turbine, and other renewables) are only available as starting point "From" system equipment connections and are automatically eliminated as available ending "To" connections 1205. Furthermore, power sources are only allowed to have a single connection to the system. If multiple connections to a system are desired, then a power source must be connected to a busbar from which additional connections can originate. Additionally, the list of available ending system equipment for the wire or cable connection will not include the already selected "From" input connection system equipment and is filtered to display 1209 only busbars, loads and nodes that are undefined 1208 (they have no voltage value defined and may be disconnected from the system), and system busbars and nodes that have a matching nominal voltage 1207. For example, if the "From" system equipment being connected with a wire or cable is a power source with a nominal voltage of 13,800, the list of available ending system equipment for the wire or cable connection is filtered to display only busbars, loads and nodes that are undefined (they have no voltage value defined and may be disconnected from the system), and busbars and nodes that have a matching nominal voltage of 13,800. System busbars and nodes can be phase flexible, that is, they can be defined as single-phase, two-phase or three-phase, while system sources and loads are either three-phase or single-phase. This technique eliminates the need to further filter the "From" and "To" connection choices based on phase value.

Continuing with FIG. 12, in another embodiment, when a connector 1201 that is a transformer is selected 1206, and the system equipment from which the connection starts at is chosen 1203, the cloud computing engineering application filters all system equipment 1204 and provides a list of possible equipment to which the connector can end its connection at 1209. Power sources (e.g. power utility, generator, solar, wind-turbine, and other renewables) are only available as starting point "From" system equipment connections and are automatically eliminated as available ending "To" connections 1205. Since transformer's can connect system equipment at differing voltage values (they can transform the "From" input connection voltage to the "To" output connection voltage), with the exception of the already selected "From" input connection system equipment, the filtered list 1209 will include all busbars and nodes in the system at all nominal voltage values 1210 along with all undefined system busbars, nodes and loads (they have no voltage value defined and may be disconnected from the system) 1208.

Figure 13:
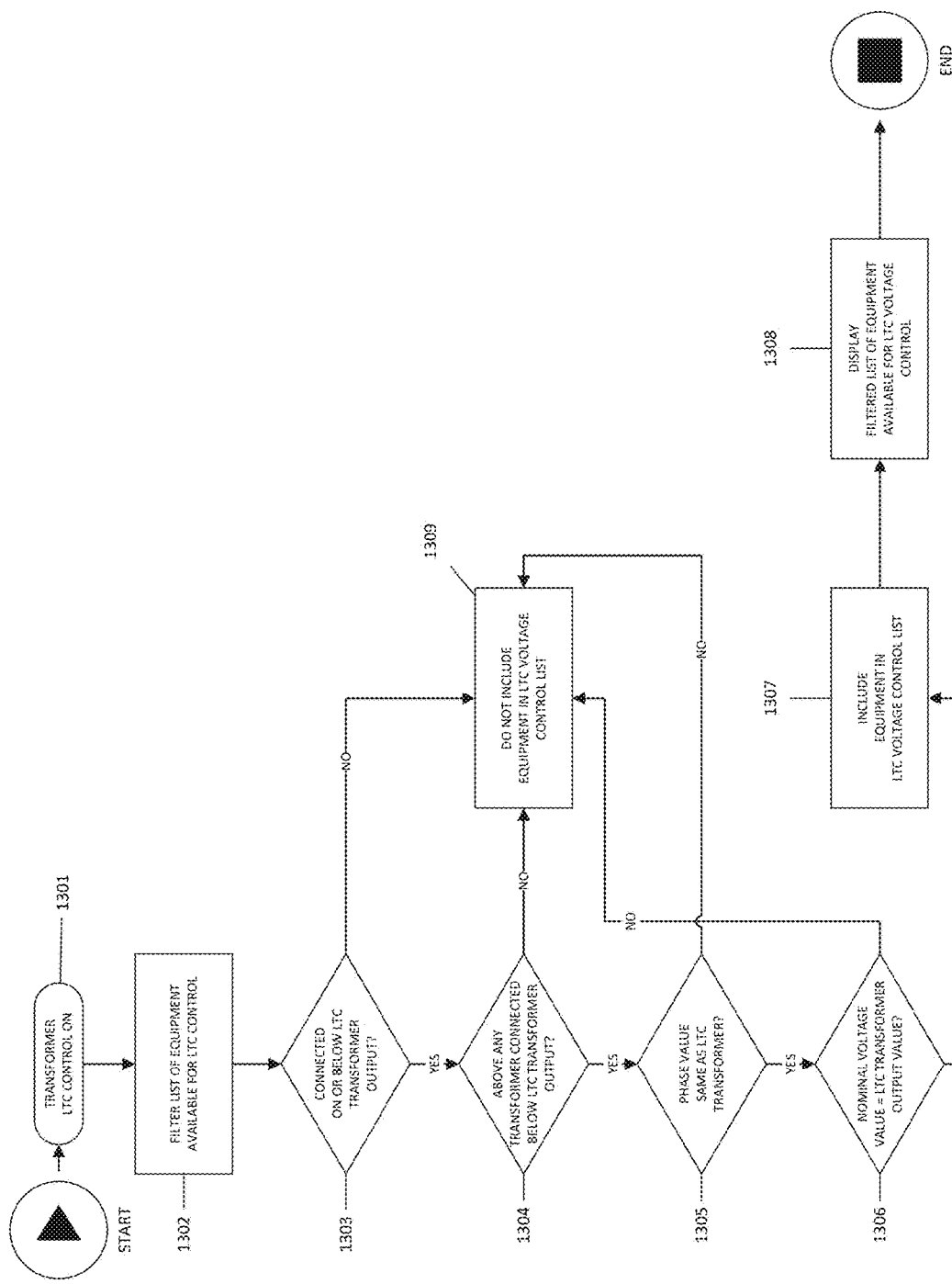
FIG. 13 is an illustration of a flowchart describing a method to manage system equipment that can have their voltage controlled by a transformer with Load Tap Changing (LTC) voltage control capabilities in accordance with one embodiment.

FIG. 13 is an illustration of a flowchart describing a method to manage system equipment that can have their voltage controlled by a transformer with Load Tap Changing (LTC) voltage control capabilities. This method minimizes complexity, design errors and illogical system equipment selections. In one embodiment, if the LTC control feature is turned on for a transformer 1301 that is connected to a system, the cloud computing engineering application filters 1302 all connected system equipment based on a set of rules 1303, 1304, 1305, 1306 in order to determine which system equipment to include 1307 and displays 1308 a list of valid system equipment whose voltage can be logically controlled by the transformer LTC feature. Equipment not passing any of the rules 1303, 1304, 1305 and 1306 are excluded 1309 from the list. For example, if a three-phase LTC transformer's nominal output voltage is 480, then only three-phase system equipment with a nominal voltage of 480 that are connected at or below the LTC transformer output connection are displayed as system equipment at which voltage can be controlled at. Additionally transformers connected below the LTC transformer are not included. That is, the list of valid system equipment for LTC voltage control does not "step" on top of another system transformer connected below the LTC transformer.

Figure 14:
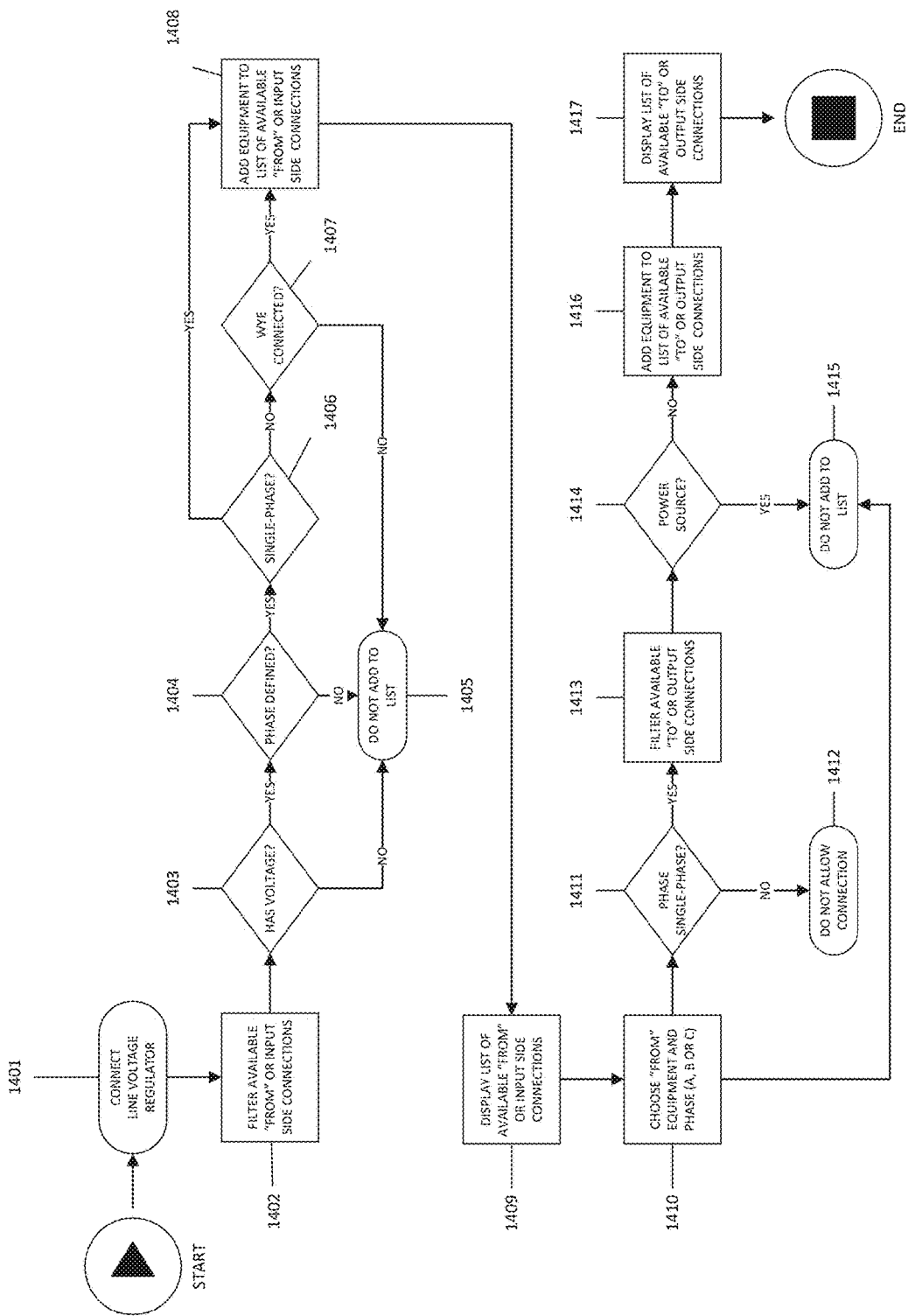
FIG. 14 is an illustration of a flowchart describing a method to manage Line Voltage Regulator (LVR) equipment system connectivity in accordance with one embodiment.

FIG. 14 is an illustration of a flowchart describing a method to manage Line Voltage Regulator (LVR) equipment system connectivity. This method minimizes complexity, design errors, and illogical system equipment connections. In one embodiment, if a connector type that is an LVR 1401 is selected, the cloud computing engineering application filters 1402 all system equipment and provides a list of possible starting "From" or input side connections 1409, which in one aspect comprises of only system equipment that have voltage 1403 and phase values defined 1404, and are either single-phase 1406 or wye connected multi-phase system equipment 1407. This check to limit "From" or input side connections is due to LVR system equipment typically operating as a single-phase device. Based on the selection of the "From" or input side connection and selected phase value (A, B or C) of the connection 1410, the cloud computing engineering application allows for only a single-phase connection 1411, filters all system equipment 1413 and displays 1417 a list of possible ending "To" or output connections which does not include the already selected "From" or input side connection 1410 or system power source (e.g. power utility, generator, solar, wind-turbine, renewable source . . . etc.) 1414 equipment.

Figure 15:
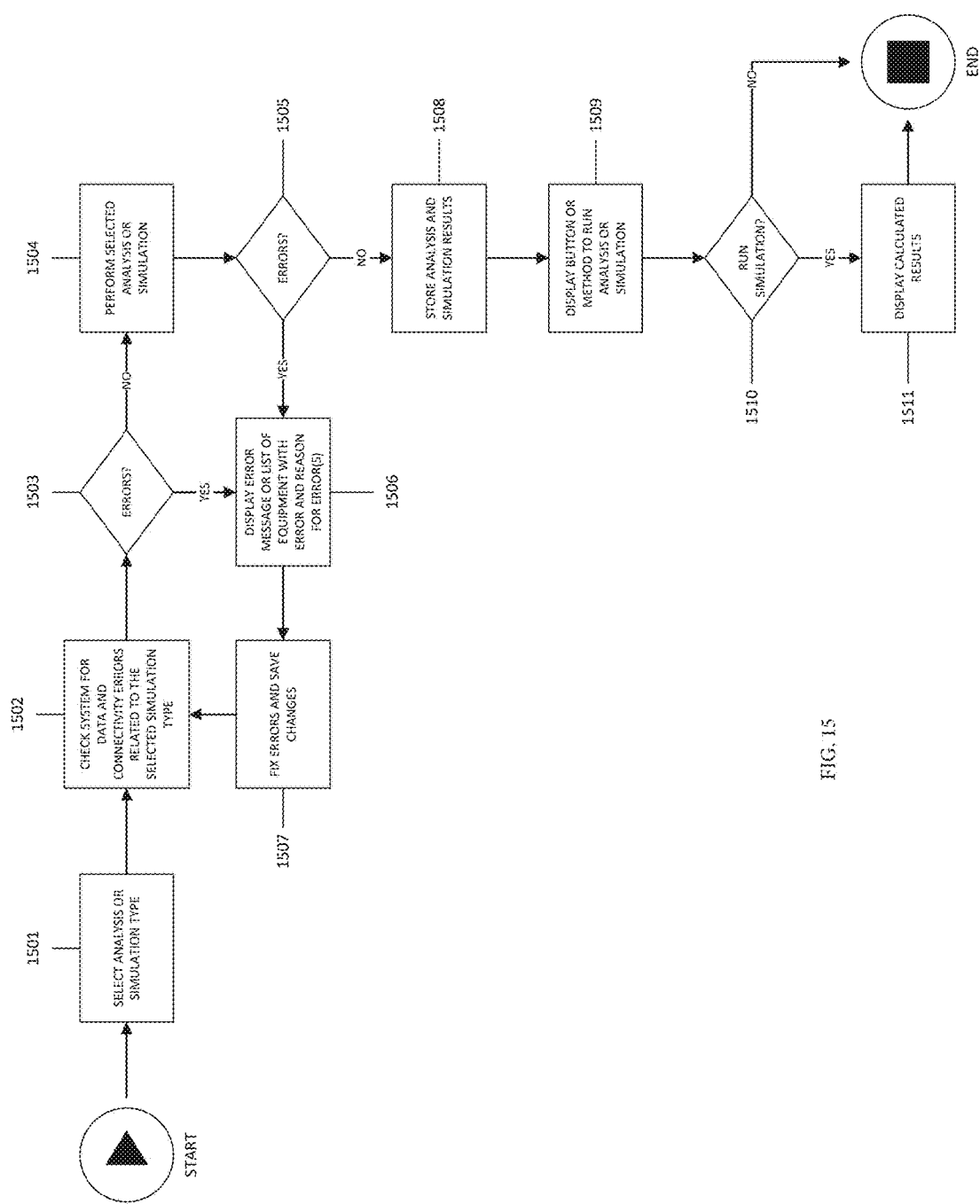
FIG. 15 is an illustration of a flowchart describing a method that increases simulation and analysis success rate, and synthetically improves the speed of analysis processes and simulations in accordance with one embodiment.

FIG. 15 is an illustration of a flowchart describing a method that increases simulation and analysis success rate, and synthetically improves the speed of analysis processes and simulations.

Some of the important needs for cloud computing engineering applications include simulation and analysis success, coupled with responsiveness and performance. Asynchronous callback methods and web services can be implemented at the application design level to help ensure user interface (UI) responsiveness, however, many simulators behave as discrete "black boxes" that do not expose asynchronous Application Programming Interface (API) web services. When a cloud computing engineering application user initiates a process, such as a simulation of a virtual electrical power distribution system, she expects simulation results to appear quickly or near instantly. Requiring her to wait and look at a web page UI spinner image moving around in circles for several seconds or minutes before results are calculated and displayed is not desirable. Furthermore, given the shared nature of cloud computing resources, it is possible that if many process actions, such as simulations, are requested of a cloud computing engineering application at or near the same time, that results may take even longer to calculate and display, and thus risk the appearance of a non-responsive application or service, particularly when judged by a user against the performance of alternative desktop applications.

Continuing with FIG. 15, generally there are two points of user interaction within a cloud computing engineering application that can expose application lethargy: The first is at the error-checking stage 1502; that is, when a system is checked by the cloud computing engineering application for data or connectivity errors prior to a user initiating an analysis process or simulation run. The second is at the simulation-stage 1504; that is, when a system is simulated or analyzed and calculated results are displayed. For example, cloud computing engineering application users are acceptable of having to wait a while to have an automated process validate and error-check system design and input data, particularly when such a process can save time and effort in identifying and resolving errors that help ensure simulation success. In fact, longer error checking process times may be perceived by users as a more substantial and thorough check of their system. However, once a system has been vetted and is deemed to be error-free, there is little tolerance to wait a while to have simulation or analysis calculated and displayed.

The method illustrated in FIG. 15 leverages the cognitive time flexibility afforded at the first point of user interaction, error-checking 1502, to address responsiveness concerns with a cloud computing engineering application at the second point of user interaction, initiating an analysis process or simulation 1504. That is, rather than performing a simulation or an analysis process only when a user has initiated such a request, the new method disclosed in FIG. 15 first performs an error-check 1502 and if no errors are identified 1503, then runs a process 1504, such as a simulation, irrespective of whether the user has selected to do so or not. This new method takes advantage of the time cognitively afforded by users for error-checking processes, and re-purposes some of it to perform analysis, calculations and simulations.

In one aspect, the method disclosed in FIG. 15 affords users with the most comprehensive error-checking possible. That is, even after the successful completion of a standard error-checking process 1502, additional hidden errors 1505 may exist in a system, which only an actual simulation or analysis process 1504 can expose. This is an important capability given the unlimited permutations possible when designing a system. In another aspect, this method delivers a higher success rate for an analysis process or simulation, which serves to enhance user satisfaction. That is, only upon achieving simulation or analysis process success 1508, will the cloud computing engineering application display, offer or expose a method 1509 (e.g., a button or other user interface element) for the user to initiate a simulation or analysis process request. Moreover, a high success rate for valid analysis or simulation outcomes is important if the cloud computing engineering application has a monetization model that charges for the processes a user initiates. For example, satisfaction and profitability can be greatly impacted by whether charges and fees paid for simulation results and analysis are for successful and valid simulations, or for failed and invalid simulations which the user may request refunds on.

In another aspect, the method disclosed in FIG. 15 synthetically increases the speed of analysis processes and simulations by combining error-checking 1502 with simulation and analysis 1504. That is, once a system has been vetted and deemed to be error free (i.e. the error-check has passed without finding errors and a simulation or analysis was also successfully performed) 1503 and 1504, a user will instantly see the calculated results 1511 as soon as they choose to initiate the simulation or analysis process 1510. Since a simulation was already been performed 1504 as part of the error-checking process 1502, 1503, 1505, 1506, and 1507, there is no opportunity for the appearance of application lethargy irrespective of the complexity or size of a system being analyzed or simulated, or potential cloud computing resource constraints when the analysis process or simulation is initiated.

Figure 16:
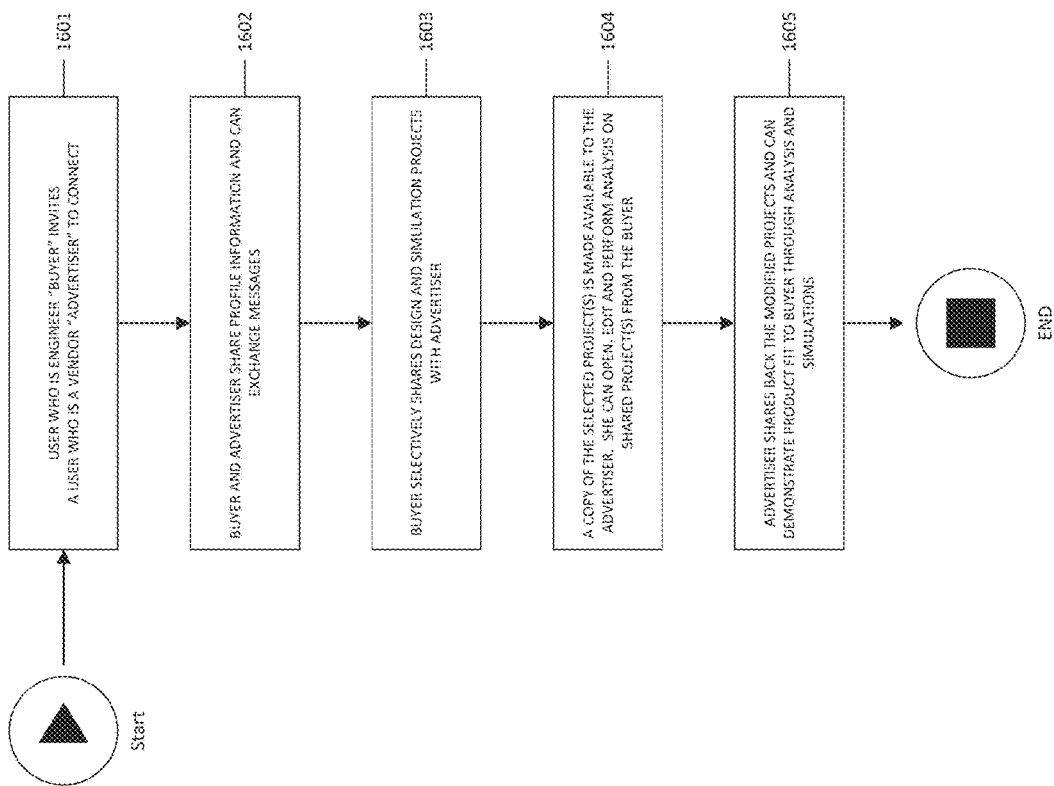
FIG. 16 is an illustration of a flowchart describing a method for advertising messaging that is based on value added collaboration between a vendor (advertiser) and an engineer (buyer) in order to create a new "advice" model for advertising in accordance with one embodiment.

FIG. 16 is an illustration of a flowchart describing a method for advertising messaging that is based on value added collaboration between a vendor (advertiser) and an engineer (buyer) in order to create a new "advice" model for advertising. In one embodiment, once a request or invitation from the buyer to connect with a vendor is made 1601, the buyer and advertiser can share contact information and other user profile data they have chosen to share 1602. The buyer can selectively share projects 1603 created with the cloud computing engineering application with the advertiser. The advertiser can open and edit a copy of the shared project 1604 with the cloud computing engineering application, and add her product features and engineering specifications in order to virtually demonstrate, through analysis and simulation 1605, product fit in addressing the buyer's needs. This approach to advertising messaging is fundamentally different than current techniques as it is not random, reveals intention, and is highly valuable since it provides vendors with the opportunity to demonstrate their product's benefits at the most influential stage—the design phase.

Figure 17:
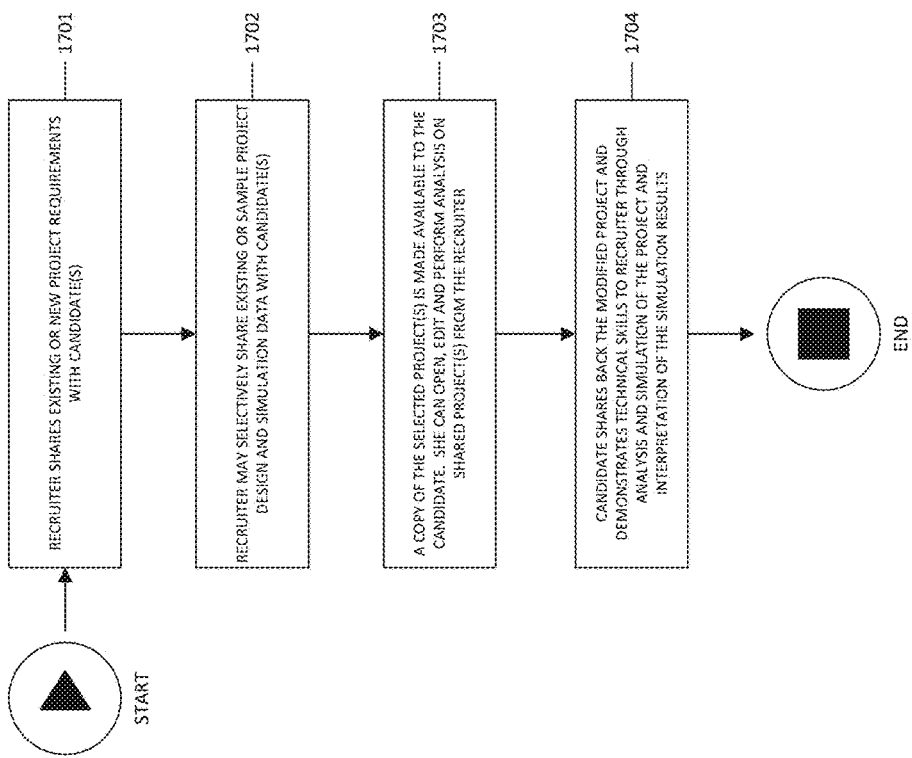
FIG. 17 is an illustration of a flowchart describing a method for better job screening and improved candidate quality selection for business social networking in accordance with one embodiment.

FIG. 17 is an illustration of a flowchart describing a method for better job screening and improved candidate quality selection for business social networking. The disclosed method more effectively screens candidates seeking employment by measuring and validating their technical skills with a sample of actual work that both the recruiter and engineer can collaboratively view, edit, analyze and discuss. In one embodiment, a job provider or recruiter shares project requirements with prospective candidates 1701, and may selectively share existing or sample project design and simulation data 1702 created with the cloud computing engineering application in order to test a candidate's technical skill level and problem solving abilities. Candidate can open and edit a copy of the shared project 1703 with the cloud computing engineering application, and modify the model, perform simulations and generate reports. The candidate can share back the modified project and their solution with the recruiter 1704 and provide her interpretation of the simulation and analysis results in order to demonstrate technical proficiency to the recruiter. Through this method, since recruiters and engineers have access to the same exact design and analysis tools, the cloud computing engineering application allows recruiters to present candidates with precise engineering design challenges within a standardized technical environment and effectively determine if a candidate has the skills they claim. Such an approach is far superior to existing business social networking methods as it offers better screening and improved candidate quality by delivering the tools needed to test technical engineering skills while eliminating opportunities for false self-promotion.

Example Client Architecture

Figure 18:
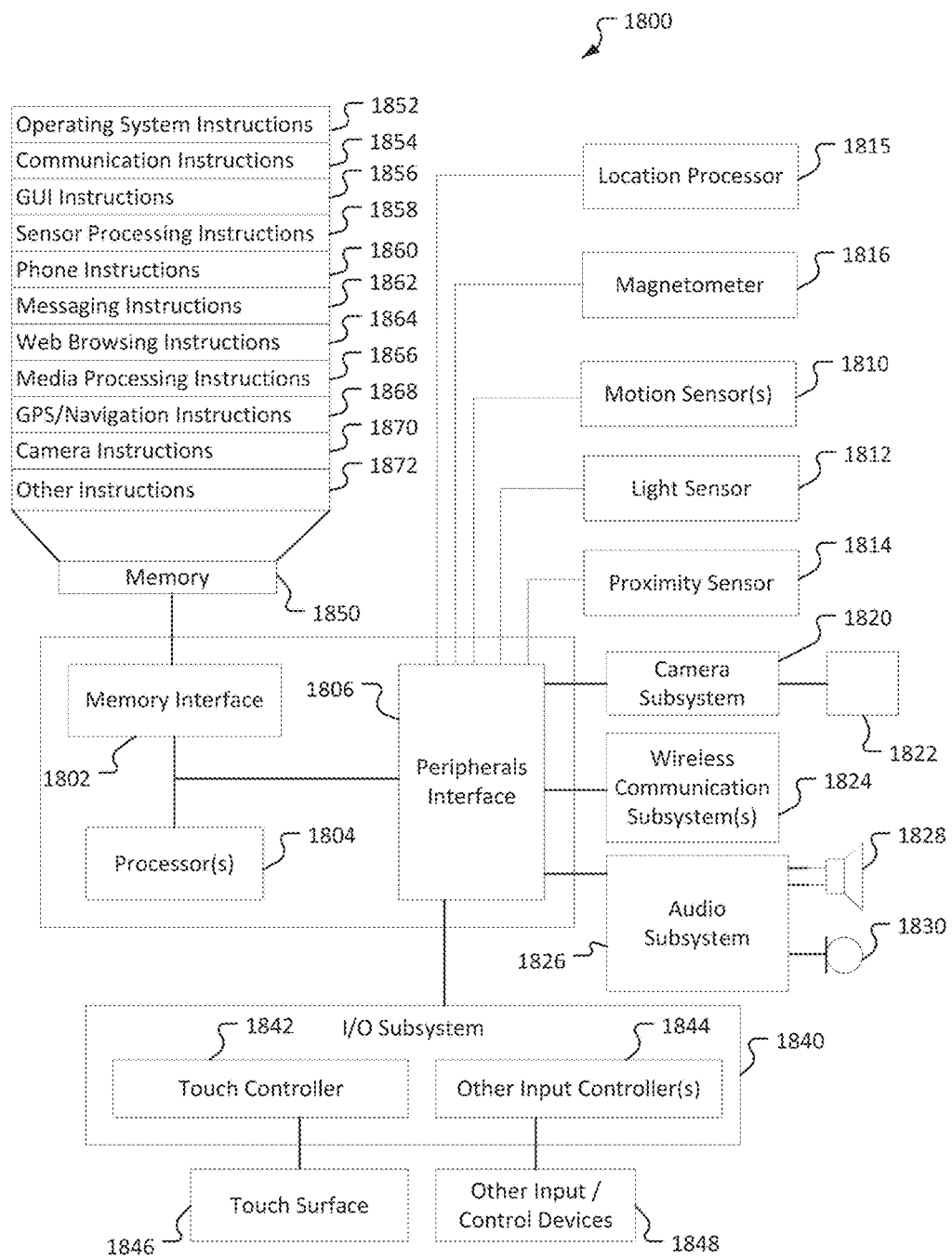
FIG. 18 is a block diagram of example mobile device architecture for implementing the features and processes described in reference to FIGS. 1-17.

FIG. 18 is a block diagram of example mobile device architecture 1800 for implementing the features and processes described in reference to FIGS. 1-17. Architecture 1800 may be implemented in any mobile device for implementing the features and processes described in reference to FIGS. 1-17, including but not limited to portable computers, smart phones and tablet computers, game consoles, wearable computers and the like. Architecture 1800 may include memory interface 1802, data processor(s), image processor(s) or central processing unit(s) 1804, and peripherals interface 1806. Memory interface 1802, processor(s) 1804 or peripherals interface 1806 may be separate components or may be integrated in one or more integrated circuits. One or more communication buses or signal lines may couple the various components.

Sensors, devices, and subsystems may be coupled to peripherals interface 1806 to facilitate multiple functionalities. For example, motion sensor 1810, light sensor 1812, and proximity sensor 1814 may be coupled to peripherals interface 1806 to facilitate orientation, lighting, and proximity functions of the device. For example, in some implementations, light sensor 1812 may be utilized to facilitate adjusting the brightness of touch surface 1846. In some implementations, motion sensor 1810 (e.g., an accelerometer, gyros) may be utilized to detect movement and orientation of the device. Accordingly, display objects or media may be presented according to a detected orientation (e.g., portrait or landscape). Other sensors may also be connected to peripherals interface 1806, such as a temperature sensor, a biometric sensor, or other sensing device, to facilitate related functionalities.

Location processor 1815 (e.g., GPS receiver chip) may be connected to peripherals interface 1806 to provide geo-referencing. Electronic magnetometer 1816 (e.g., an integrated circuit chip) may also be connected to peripherals interface 1806 to provide data that may be used to determine the direction of magnetic North. Thus, electronic magnetometer 1816 may be used with an electronic compass application.

Camera subsystem 1820 and an optical sensor 1822, e.g., a charged coupled device (CCD) or a complementary metal-oxide semiconductor (CMOS) optical sensor, may be utilized to facilitate camera functions, such as recording photographs and video clips.

Communication functions may be facilitated through one or more communication subsystems 1824. Communication subsystem(s) 1824 may include one or more wireless communication subsystems. Wireless communication subsystems 1824 may include radio frequency receivers and transmitters and/or optical (e.g., infrared) receivers and transmitters. Wired communication systems 1824 may include a port, e.g., a Universal Serial Bus (USB) port or some other wired port connection that may be used to establish a wired connection to other computing devices, such as other communication devices, network access devices, a personal computer, a printer, a display screen, or other processing devices capable of receiving or transmitting data.

The specific design and implementation of the communication subsystem 1824 may depend on the communication network(s) or medium(s) over which the device is intended to operate. For example, a device may include wireless communication subsystems designed to operate using known or standardized protocols, including but not limited to: global system for mobile communications (GSM), GPRS, enhanced data GSM environment (EDGE), IEEE 802.x (e.g., Wi-Fi, Wi-Max), code division multiple access (CDMA), Near Field Communications (NFC), Bluetooth® (including classic Bluetooth® and Bluetooth® low energy (BLE)). Wireless communication subsystems 1824 may include hosting protocols such that the device may be configured as a base station for other wireless devices. As another example, the communication subsystems may allow the device to synchronize with a host device using one or more protocols, such as, for example, the TCP/IP protocol, HTTP protocol, UDP protocol, and any other known or standardized protocol.

Audio subsystem 1826 may be coupled to a speaker 1828 and one or more microphones 1830 to facilitate voice-enabled functions, such as voice recognition, voice replication, digital recording, and telephony functions.

I/O subsystem 1840 may include touch controller 1842 and/or other input controller(s) 1844. Touch controller 1842 may be coupled to a touch surface 1846. Touch surface 1846 and touch controller 1842 may, for example, detect contact and movement or break thereof using any of a number of touch sensitivity technologies, including but not limited to capacitive, resistive, infrared, and surface acoustic wave technologies, as well as other proximity sensor arrays or other elements for determining one or more points of contact with touch surface 1846. In one implementation, touch surface 1846 may display virtual or soft buttons and a virtual keyboard, which may be used as an input/output device by the user.

Other input controller(s) 1844 may be coupled to other input/control devices 1848, such as one or more buttons, rocker switches, thumb-wheel, infrared port, USB port, and/or a pointer device such as a stylus. The one or more buttons (not shown) may include an up/down button for volume control of speaker 1828 and/or microphone 1830.

In some implementations, architecture 1800 may present recorded audio and/or video files, such as MP3, AAC, and MPEG video files. In some implementations, architecture 1800 may include the functionality of an MP3 player and may include a pin connector for tethering to other devices. Other input/output and control devices may be used.

Memory interface 1802 may be coupled to memory 1850. Memory 1850 may include high-speed random access memory or non-volatile memory, such as one or more magnetic disk storage devices, one or more optical storage devices, or flash memory (e.g., NAND, NOR). Memory 1850 may store operating system 1852, such as Darwin, RTXC, LINUX, UNIX, OS X, WINDOWS or an embedded operating system such as VxWorks. Operating system 1852 may include instructions for handling basic system services and for performing hardware dependent tasks. In some implementations, operating system 1852 may include a kernel (e.g., UNIX kernel).

Memory 1850 may also store communication instructions 1854 to facilitate communicating with one or more additional devices, one or more computers or servers, including peer-to-peer communications, as described in reference to FIGS. 1-6. Communication instructions 1854 may also be used to select an operational mode or communication medium for use by the device, based on a geographic location (obtained by the GPS/Navigation instructions 1868) of the device. Memory 1850 may include graphical user interface instructions 1856 to facilitate graphical user interface processing, including a touch model for interpreting touch inputs and gestures; sensor processing instructions 1858 to facilitate sensor-related processing and functions; phone instructions 1860 to facilitate phone-related processes and functions; electronic messaging instructions 1862 to facilitate electronic-messaging related processes and functions; web browsing instructions 1864 to facilitate web browsing-related processes and functions; media processing instructions 1866 to facilitate media processing-related processes and functions; GPS/Navigation instructions 1868 to facilitate GPS and navigation-related processes; camera instructions 1870 to facilitate camera-related processes and functions; and other instructions 1872 for performing some or all of the processes, as described in reference to FIGS. 1-17.

Each of the above identified instructions and applications may correspond to a set of instructions for performing one or more functions described above. These instructions need not be implemented as separate software programs, procedures, or modules. Memory 1850 may include additional instructions or fewer instructions. Furthermore, various functions of the device may be implemented in hardware and/or in software, including in one or more signal processing and/or application specific integrated circuits (ASICs).

Example Server Architecture

Figure 19:
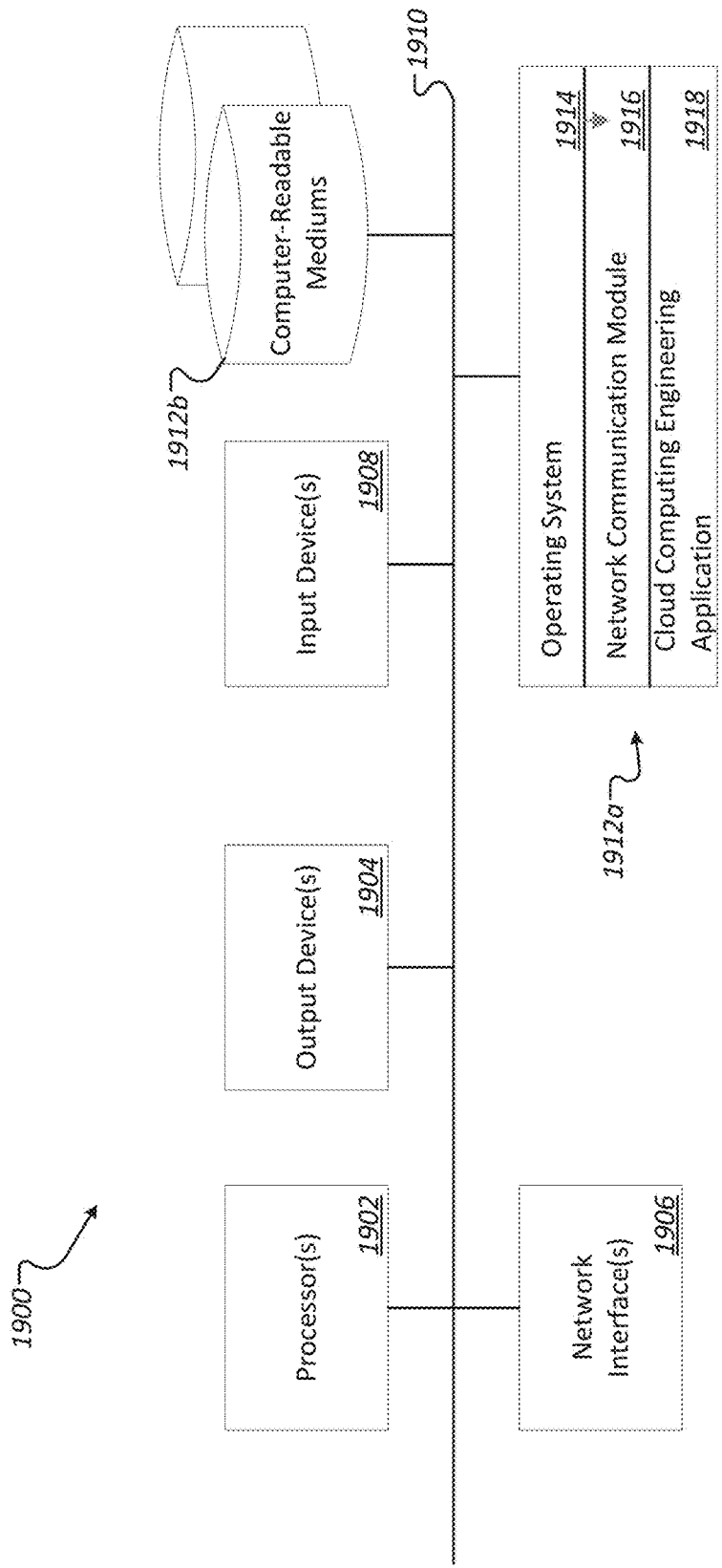
FIG. 19 is a block diagram of example server computer system architecture for implementing the features and processes described in reference to FIGS. 1-17.

FIG. 19 is a block diagram of example server computer system architecture 1900 for implementing the features and processes described in reference to FIGS. 1-17. Other architectures are possible, including architectures with more or fewer components. In some implementations, architecture 1900 includes one or more processors 1902 (e.g., dual-core Intel® Xeon® Processors), one or more output devices 1904 (e.g., LCD), one or more network interfaces 1906, one or more input devices 1908 (e.g., mouse, keyboard, touch-sensitive display) and one or more non-transitory computer-readable mediums 1912b and memory 1912a (e.g., RAM, ROM, SDRAM, hard disk, optical disk, flash memory, etc.). These components can exchange communications and data over one or more communication channels 1910 (e.g., buses), which can utilize various hardware and software for facilitating the transfer of data and control signals between components.

The term "non-transitory computer-readable medium" refers to any medium that participates in providing instructions to processor 1902 for execution, including without limitation, non-volatile media (e.g., optical or magnetic disks), volatile media (e.g., memory) and transmission media. Transmission media includes, without limitation, coaxial cables, copper wire and fiber optics.

Computer-readable mediums 1912b or memory 1912a can further include operating system 1914 (e.g., Mac OS® server, Windows® NT server), network communication module 1916 and dynamic content presentation module 1918. Operating system 1914 can be multi-user, multiprocessing, multitasking, multithreading, real time, etc. Operating system 1914 performs basic tasks, including but not limited to: recognizing input from and providing output to devices 1904; keeping track and managing files and directories on storage devices 1912b and memory 1912a; controlling peripheral devices; and managing traffic on the one or more communication channels 1910. Network communications module 1916 includes various components for establishing and maintaining network connections (e.g., software for implementing communication protocols, such as TCP/IP, HTTP, etc.). Dynamic content presentation module 1918 provides the features and performs the process, described in reference to FIGS. 1-17.

Architecture 1900 can be included in any computer device, including one or more server computers each having one or more processing cores. Architecture 1900 can be implemented in a parallel processing or peer-to-peer infrastructure or on a single device with one or more processors. Software can include multiple software components or can be a single body of code.

The features described may be implemented in digital electronic circuitry or in computer hardware, firmware, software, or in combinations of them. The features may be implemented in a computer program product tangibly embodied in an information carrier, e.g., in a machine-readable storage device, for execution by a programmable processor; and method steps may be performed by a programmable processor executing a program of instructions to perform functions of the described implementations by operating on input data and generating output.

The described features may be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that may be used, directly or indirectly, in a computer to perform a certain activity or bring about a certain result. A computer program may be written in any form of programming language (e.g., Objective-C, Java), including compiled or interpreted languages, and it may be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer may communicate with mass storage devices for storing data files. These mass storage devices may include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory may be supplemented by, or incorporated in, ASICs (application-specific integrated circuits).

To provide for interaction with an author, the features may be implemented on a computer having a display device such as a CRT (cathode ray tube) or LCD (liquid crystal display) monitor for displaying information to the author and a keyboard and a pointing device such as a mouse or a trackball by which the author may provide input to the computer.

The features may be implemented in a computer system that includes a back-end component, such as a data server or that includes a middleware component, such as an application server or an Internet server, or that includes a front-end component, such as a client computer having a graphical user interface or an Internet browser, or any combination of them. The components of the system may be connected by any form or medium of digital data communication such as a communication network. Examples of communication networks include a LAN, a WAN and the computers and networks forming the Internet.

The computer system may include clients and servers. A client and server are generally remote from each other and typically interact through a network. The relationship of client and server arises by virtue of computer programs running on the respective computers and having a client-server relationship to each other.

One or more features or steps of the disclosed embodiments may be implemented using an Application Programming Interface (API). An API may define on or more parameters that are passed between a calling application and other software code (e.g., an operating system, library routine, function) that provides a service, that provides data, or that performs an operation or a computation.

The API may be implemented as one or more calls in program code that send or receive one or more parameters through a parameter list or other structure based on a call convention defined in an API specification document. A parameter may be a constant, a key, a data structure, an object, an object class, a variable, a data type, a pointer, an array, a list, or another call. API calls and parameters may be implemented in any programming language. The programming language may define the vocabulary and calling convention that a programmer will employ to access functions supporting the API.

In some implementations, an API call may report to an application the capabilities of a device running the application, such as input capability, output capability, processing capability, power capability, communications capability, etc.

A number of implementations have been described. Nevertheless, it will be understood that various modifications may be made. Elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method comprising:
   displaying, by a computer device, a user interface;
   displaying, by the computer device, a single-line diagram in the user interface;
   displaying in the single-line diagram, by the computing device, a first component object representing a first component of a simulated electrical power distribution system;
   displaying in the single-line diagram, by the computing device, a second component object representing a second component of the simulated electrical power distribution system;
   receiving user input; and
   responsive to the user input, displaying, by the computing device in the single-line diagram, a single connector object, the single connector object being separate and distinct from the first and second component objects and not including any component object, the single connector object connecting the first and second component objects in the single-line diagram, the connector object beginning at the first component object as a first single line, then branching into two or more internal lines, and then connecting into a second single line at the second component object, wherein each of the internal lines is a different color and represents a different phase of the simulated electrical power distribution system.

2. The method of claim 1, further comprising:
   animating or changing the color of the first or second component object to reflect the presence or absence of voltage.

3. The method of claim 2, wherein the single lines and internal lines are broken lines.

4. The method of claim 1, further comprising:
automatically configuring, by the computing device, the first or second component object to inherit electrical characteristics of at least one connection point of the simulated electrical power distribution system.

5. The method of claim 4, further comprising:
determining, by the computing device, that a third component object is connected to the at least one connection point, to the at least one connection point, the third component object representing a third component in the simulated electrical power distribution system; and
responsive to the determining, configuring the first or second component object to have the same input and output connections as the third component object.

6. The method of claim 4, further comprising:
receiving, by the computing device, input editing electrical characteristics or connections of the first or second component object; and
automatically changing, by the computing device, affected connections in the simulated electrical power distribution system to match the edited electrical characteristics or connections of the first or second component object.

7. The method of claim 4, further comprising:
determining, by the computing device, that the first or second component object is connected in parallel with a third component object, the third component object representing a third component in the simulated electrical power distribution system; and
changing, by the computing device, the nominal input and output voltages and input and output connections of the third component object to match the nominal input and output voltages and input and output connections of the first or second component object.

8. The method of claim 7, where at least one of the first, second or third component object represents an electrical transformer and the input and output connections are winding connections.

9. The method of claim 7, further comprising:
determining, by the computing device, that one of the first, second or third component object represents an electrical transformer that includes load tap changing (LTC) voltage control capability and the capability is turned on; and
filtering, by the computing device, equipment connected to the LTC transformer based on a set of rules; and
displaying a list of filtered equipment that can be connected to the LTC transformer.

10. The method of claim 4, further comprising:
receiving, by the computing device, input to connect the first or second component object to the at least one connection point of the simulated electrical power distribution system;
determining, by the computing device, that electrical characteristics of the first or second component object and the connection point do not match; and
preventing, by the computing device, the first or second component object from being connected to the at least one connection point.

11. The method of claim 4, further comprising:
automatically inserting, by the computing device, a swing bus or slack bus component object into the simulated electrical power distribution system, the swing bus or sack bus having predefined or default electrical characteristics and data values.

12. The method of claim 1 comprising:
generating a user interface element, the user interface element configured to display a first layer of simulation data, the simulation data for simulating the electrical power distribution system, the displayed first layer of simulation data representing a first level of complexity of the electrical power distribution system;
receiving a first configuring input; and
responsive to the first configuring input, configuring the user interface element to display a second layer of simulation data, the second layer of simulation data representing a second level of complexity of the electrical power distribution system that is greater than the first level of complexity of the electrical power distribution system, the displayed second layer of simulation data visually indicating a hierarchical relationship of complexity between the first and second layers of simulation data.

13. The method of claim 12, wherein the first and second layers of simulation data inputs are displayed in first and second panels, respectively, where the second panel is displayed below the first panel by animating the second panel to slide out from underneath the first panel.

14. The method of claim 12, further comprising:
receiving a second configuring input selecting one of an edit mode or view-only mode for editing and viewing the first or second layer of simulation data; and
responsive to the configuring second input, configuring the user interface element for the selected mode.

15. The method of claim 12, further comprising:
receiving a second configuring input; and
responsive to the second configuring input, displaying data that is ancillary to the first or second layer of simulation data, where the displayed ancillary data visually indicates that the ancillary data is at the same level in the hierarchical relationship of complexity as the first or second layer of simulation data.

16. The method of claim 15, where the ancillary data is displayed by a third panel that is animated to slide horizontally from a left or a right side of the first or second panel.

17. A system comprising:
one or more processors;
memory coupled to the one or more processors and storing instructions, which, when executed by the one or more processors, causes the one or more processors to perform operations comprising:
displaying a user interface;
displaying a single-line diagram in the user interface;
displaying in the single-line diagram a first component object representing a first component of an electrical power distribution system;
displaying in the single-line diagram a second component object representing a second component of the electrical power distribution system;
receiving user input; and
responsive to the user input, displaying in the single-line diagram, a single connector object, the single connector object being separate and distinct from the first and second component objects and not including any component object, the single connector object connecting the first and second component objects in the single-line diagram, the connector object beginning at the first component object as a first single line, then branching into two or more internal lines, and then connecting into a second single line at the second component object, wherein each of the internal lines is a different color and represents a different phase of the electrical power distribution system.

18. The system of claim 17, further comprising:
automatically configuring, by the computing device, the first or second component object to inherit electrical characteristics of at least one connection point of the simulated electrical power distribution system.

* * * * *